United States Patent
Brendle et al.

(10) Patent No.: US 11,803,521 B2
(45) Date of Patent: Oct. 31, 2023

(54) IMPLEMENTATION OF DATA ACCESS METRICS FOR AUTOMATED PHYSICAL DATABASE DESIGN

(71) Applicant: SAP SE, Walldorf (DE)

(72) Inventors: Michael Brendle, Leimen (DE); Norman May, Karlsruhe (DE); Robert Schulze, Dresden (DE); Alexander Boehm, Schwetzingen (DE); Guido Moerkotte, Schriesheim (DE); Michael Grossniklaus, Kreuzlingen (CH)

(73) Assignee: SAP SE, Walldorf (DE)

( * ) Notice: Subject to any disclaimer, the term of this patent is extended or adjusted under 35 U.S.C. 154(b) by 79 days.

(21) Appl. No.: 17/324,896

(22) Filed: May 19, 2021

(65) Prior Publication Data
US 2022/0269684 A1 Aug. 25, 2022

Related U.S. Application Data

(63) Continuation of application No. 17/316,901, filed on May 11, 2021, now Pat. No. 11,550,762.
(Continued)

(51) Int. Cl.
*G06F 16/21* (2019.01)
*G06F 16/22* (2019.01)
(Continued)

(52) U.S. Cl.
CPC .......... *G06F 16/21* (2019.01); *G06F 11/3414* (2013.01); *G06F 11/3428* (2013.01);
(Continued)

(58) Field of Classification Search
CPC ................ G06F 16/21; G06F 16/2272; G06F 16/24575; G06F 16/24552; G06F 11/3428
See application file for complete search history.

(56) References Cited

U.S. PATENT DOCUMENTS 8,935,205 B2  1/2015  Hildenbrand et al.
9,152,626 B2  10/2015  Seufert et al.
(Continued)

OTHER PUBLICATIONS

Extended European Search Report issued in European Application No. 22157240.7 dated Aug. 9, 2022, 10 pages.
(Continued)

*Primary Examiner* — Dinku W Gebresenbet
*Assistant Examiner* — Dustin D Eyers
(74) *Attorney, Agent, or Firm* — Fish & Richardson P.C.

(57) ABSTRACT

The present disclosure involves systems, software, and computer implemented methods for improved design and implementation of data access metrics for automated physical database design. An example method includes identifying a database workload for which index advisor access counters are to be tracked. Each SQL statement in the database workload is executed. For each SQL statement, attribute sets are determined for which a selection predicate filters a result for an SQL statement. An output cardinality of each selection predicate is determined. A logarithmic counter for an attribute set corresponding to the selection predicate is determined based on the output cardinality of the selection predicate. The determined logarithmic counter is incremented. Respective values for logarithmic counters of the determined attributes are provided to an index advisor. The index advisor determines attribute sets for which to propose an index based on the logarithmic counters of the respective attribute sets.

19 Claims, 25 Drawing Sheets

Related U.S. Application Data

(60) Provisional application No. 63/153,214, filed on Feb. 24, 2021.

(51) Int. Cl.

| | |
|---|---|
| *G06F 11/34* | (2006.01) |
| *G06F 16/2455* | (2019.01) |
| *G06F 16/2457* | (2019.01) |
| *G06F 16/2453* | (2019.01) |
| *G06F 16/215* | (2019.01) |
| *H03M 7/30* | (2006.01) |

(52) U.S. Cl.
CPC .......... *G06F 16/213* (2019.01); *G06F 16/215* (2019.01); *G06F 16/217* (2019.01); *G06F 16/2272* (2019.01); *G06F 16/2282* (2019.01); *G06F 16/2455* (2019.01); *G06F 16/24545* (2019.01); *G06F 16/24552* (2019.01); *G06F 16/24575* (2019.01); *H03M 7/6064* (2013.01)

(56) References Cited

U.S. PATENT DOCUMENTS

| | | | |
|---|---|---|---|
| 9,189,520 | B2 | 11/2015 | May et al. |
| 9,329,899 | B2 | 5/2016 | Ailamaki et al. |
| 9,361,273 | B2 | 6/2016 | Dannecker et al. |
| 9,378,233 | B2 | 6/2016 | Lee et al. |
| 9,454,571 | B2 | 9/2016 | Grosse et al. |
| 9,483,513 | B2 | 11/2016 | Heidel et al. |
| 9,720,942 | B2 | 8/2017 | Kaufmann et al. |
| 9,747,313 | B2 | 8/2017 | Kaufmann et al. |
| 10,061,808 | B2 | 8/2018 | Kim et al. |
| 10,140,326 | B2 | 11/2018 | Sherkat et al. |
| 10,185,744 | B2 | 1/2019 | Bensberg et al. |
| 10,248,688 | B2 | 4/2019 | Grosse et al. |
| 10,261,950 | B2 | 4/2019 | Lee et al. |
| 10,275,508 | B2 | 4/2019 | Bensberg et al. |
| 10,282,351 | B2 | 5/2019 | Bensberg et al. |
| 10,353,895 | B2 | 7/2019 | Park et al. |
| 10,482,085 | B2 | 11/2019 | Moerkotte et al. |
| 10,496,656 | B2 | 12/2019 | Gaumnitz et al. |
| 10,534,775 | B2 | 1/2020 | Moerkotte et al. |
| 10,545,974 | B2 | 1/2020 | Brunel et al. |
| 10,592,509 | B2 | 3/2020 | Ziegler et al. |
| 10,671,625 | B2 | 6/2020 | Schulze et al. |
| 10,713,284 | B2 | 7/2020 | Bensberg et al. |
| 10,733,185 | B2 | 8/2020 | Psaropoulos et al. |
| 10,762,071 | B2 | 9/2020 | Schulze et al. |
| 10,776,353 | B2 | 9/2020 | Schulze et al. |
| 10,824,673 | B2 | 11/2020 | Rebholz et al. |
| 10,872,086 | B2 | 12/2020 | Moerkotte et al. |
| 10,877,956 | B2 | 12/2020 | Park et al. |
| 10,885,062 | B2 | 1/2021 | Andrei et al. |
| 10,891,234 | B2 | 1/2021 | Noll et al. |
| 10,990,427 | B2 | 4/2021 | Kroll et al. |
| 2005/0223026 | A1* | 10/2005 | Chaudhuri ............ G06F 16/217 |
| 2006/0074872 | A1* | 4/2006 | Gordon ............. G06F 16/24552 |
| 2008/0307009 | A1 | 12/2008 | Anderson et al. |
| 2009/0235252 | A1 | 9/2009 | Weber et al. |
| 2010/0257151 | A1 | 10/2010 | Lohman et al. |
| 2013/0204879 | A1* | 8/2013 | Zeng ........................ G06F 16/22 707/747 |
| 2014/0114728 | A1 | 4/2014 | Kaufmann et al. |
| 2016/0042039 | A1 | 2/2016 | Kaufmann et al. |
| 2017/0017674 | A1 | 1/2017 | Scheuer et al. |
| 2018/0011892 | A1* | 1/2018 | Kimura ............... G06F 16/2365 |
| 2018/0088853 | A1* | 3/2018 | Kotra .................. G06F 12/0842 |
| 2018/0329974 | A1 | 11/2018 | Bensberg et al. |
| 2018/0357291 | A1 | 12/2018 | Choi et al. |
| 2019/0130001 | A1 | 5/2019 | May et al. |
| 2019/0243816 | A1 | 8/2019 | Gaumnitz et al. |
| 2019/0266272 | A1 | 8/2019 | Wolf et al. |
| 2019/0278608 | A1 | 9/2019 | Psaropoulos et al. |
| 2019/0370257 | A1 | 12/2019 | Wolf et al. |
| 2020/0117648 | A1 | 4/2020 | Gaumnitz et al. |
| 2020/0192884 | A1 | 6/2020 | Bao et al. |
| 2020/0233661 | A1 | 7/2020 | Grosse et al. |
| 2020/0250167 | A1 | 8/2020 | Brunel et al. |
| 2020/0387495 | A1 | 12/2020 | Pathak et al. |
| 2020/0401405 | A1 | 12/2020 | Lasch et al. |
| 2020/0401530 | A1* | 12/2020 | Abulila ................. G06F 12/124 |
| 2020/0403633 | A1 | 12/2020 | Lasch et al. |

OTHER PUBLICATIONS

U.S. Appl. No. 16/739,352, Noll et al., filed Jan. 10, 2020.
U.S. Appl. No. 17/316,901, Brendle et al., filed May 11, 2021.
U.S. Appl. No. 17/324,874, Brendle et al., filed May 19, 2021.
U.S. Appl. No. 17/324,914, Brendle et al., filed May 19, 2021.
Agrawal et al., "Database tuning advisor for microsoft sql server 2005." Proceedings of the 2005 ACM SIGMOD international conference on Management of data, Jun. 2005, 12 pages.
Athanassoulis et al., "Optimal column layout for hybrid workloads." Proceedings of the VLDB Endowment 12.13, Sep. 2019, 2393-2407, 15 pages.
Boncz et al., "JCC-H: adding join crossing correlations with skew to TPC-H." Technology Conference on Performance Evaluation and Benchmarking, Springer, Cham, Aug. 2017, 17 pages.
Curino et al., "Schism: a workload-driven approach to database replication and partitioning." Proceedings of the VLDB Endowment vol. 3, No. 1, 2010, 10 pages.
Damme et al., "From a comprehensive experimental survey to a cost-based selection strategy for lightweight integer compression algorithms." ACM Transactions on Database Systems (TODS) 44.3, Jun. 2019, 46 pages.
Das et al., "Automated demand-driven resource scaling in relational database-as-a-service." Proceedings of the 2016 International Conference on Management of Data, Jun. 2016, 12 pages.
Funke et al., "Compacting transactional data in hybrid OLTP & OLAP databases." Proceedings of the VLDB Endowment vol. 5, No. 11, Aug. 2012, 12 pages.
Gurajada et al., "Btrim: hybrid in-memory database architecture for extreme transaction processing in vldbs." Proceedings of the VLDB Endowment 11.12, Aug. 2018, 1889-1901, 13 pages.
Huang et al., "X-Engine: An optimized storage engine for large-scale E-commerce transaction processing." Proceedings of the 2019 International Conference on Management of Data, Jun. 2019, 15 pages.
Kester et al., "Access path selection in main-memory optimized data systems: Should I scan or should I probe?" Proceedings of the 2017 ACM International Conference on Management of Data, May 2017, 16 pages.
Kossmann et al., "Magic mirror in my hand, which is the best in the land? an experimental evaluation of index selection algorithms." Proceedings of the VLDB Endowment 13.12, Jul. 2020, 2382-2395, 14 pages.
Leis et al., "How good are query optimizers, really?." Proceedings of the VLDB Endowment 9.3, Nov. 2015, 204-215, 12 pages.
Lemke et al., "Speeding up queries in column stores: a case for compression." DaWaK, 2010, 117-129, 13 pages.
Levandoski et al., "Identifying hot and cold data in main-memory databases." 2013 IFEE 29th International Conference on Data Engineering (ICDE), IEEE, Apr. 2013, 12 pages.
Lu et al., "Speedup your analytics: Automatic parameter tuning for databases and big data systems." Proceedings of the VLDB Endowment, Aug. 2019, 4 pages.
May et al., "SAP HANA—The evolution of an in-memory DBMS from Pure OLAP processing towards mixed workloads." Datenbanksysteme für Business, Technologie und Web, BTW, 2017, 19 pages.
Metwally et al., "Efficient computation of frequent and top-k elements in data streams." International conference on database theory. Springer, Berlin, Heidelberg, Jan. 2005, 21 pages.
Nathan et al., "Learning multi-dimensional indexes." Proceedings of the 2020 ACM SIGMOD International Conference on Management of Data, Jun. 2020, 16 pages.

(56) References Cited

OTHER PUBLICATIONS

Noll et al., "Analyzing memory accesses with modem processors." Proceedings of the 16th International Workshop on Data Management on New Hardware, Jun. 2020, 9 pages.

Rao et al., "Automating physical database design in a parallel database." Proceedings of the 2002 ACM SIGMOD international conference on Management of data, Jun. 2002, 12 pages.

Serafini et al., "Clay: Fine-grained adaptive partitioning for general database schemas." Proceedings of the VLDB Endowment 10.4, Nov. 2016, 445-456, 12 pages.

Sherkat et al., "Native store extension for SAP HANA." Proceedings of the VLDB Endowment 12.12, Aug. 2019, 2047-2058, 12 pages.

Storm et al., "Adaptive self-tuning memory in DB2." Proceedings of the 32nd international conference on Very large data bases, Sep. 2006, 12 pages.

TPC, Transaction Processing Performance Council. "TPC Benchmark™ E. Revision 2.18.0", 2018, 138 pages.

\* cited by examiner

Use Case 1 (Index Advisor) Let $A_{i,s} \in \mathcal{P}(\mathcal{A}(R_i))$ be a set of attributes from the power set of all attributes that is uniquely identified by $s \in [1, |\mathcal{P}(\mathcal{A}(R_i))|]$, $I_{i,s}$ a single-/multi-column index defined over $A_{i,s}$, and $\mathbb{I}$ the set of all possible indexes over all relations. An index advisor proposes an index configuration $IC \subseteq \mathbb{I}$ such that the estimated execution time $\widehat{\mathcal{E}}$ of a workload $W$ based on workload execution statistics $FStat$ is minimized while the estimated additional memory consumption $\widehat{\mathcal{M}}$ of the indexes adheres to a given memory budget $MB$:

$$\arg\min_{IC \subseteq \mathbb{I}} \widehat{\mathcal{E}}(IC, W, FStat) \quad \text{subject to } \widehat{\mathcal{M}}(IC) \leq MB.$$

FIG. 2B

We define a workload $W$ as a multiset of SQL statements and $T(q)$ as the physical execution plan of a SQL statement $q \in W$. For a workload $W$, we define workload execution statistics $FStat$ that includes:

F1 (Index Advisor): For each executed SQL statement $q \in W$, $FStat$ stores for each selection $\sigma_p(R_i)$ on a base relation $R_i \in \mathcal{R}$ in the physical execution plan $T(q)$ that consists of an index-SARGable predicate $p$, a tuple $(|\sigma_p(R_i)|, \mathcal{F}(p))$, where $|\sigma_p(R_i)|$ is the output cardinality of $\sigma_p(R_i)$ and $\mathcal{F}(p)$ are the free attributes contained in $p$.

FIG. 2C

| $|\sigma_p(R_i)|$ | $\mathcal{F}(p)$ |
|---|---|
| 3,774,696 | { O_ORDERDATE } |
| 299,496 | { C_MKTSEGMENT } |

FIG. 2D

Access Counter 1 (Index Advisor)
*Physical Accesses:* We consider each selection $\sigma_p(R_i)$ consisting of an index-SARGable predicate, and its actual output cardinality $|\sigma_p(R_i)|$, collected during query execution.
*Lazy Counters:* For a base $b \in \mathbb{R}$ and a set of attributes $A_{i,s} \in \wp(\mathcal{A}(R_i))$, we create and maintain integer counters $X^{idx}_{i,s,0}, \ldots, X^{idx}_{i,s,r}, \ldots, X^{idx}_{i,s,\lceil \log_b(\phi \cdot |R_i|) \rceil}$ if there exists a selection $\sigma_p(R_i) \in T(q), q \in W$ such that $A_{i,s} \subseteq \mathcal{F}(p)$ and $|\sigma_p(R_i)| < \phi \cdot |R_i|$.
*Interval Counting:* A counter $X^{idx}_{i,s,r}$ is incremented by 1 for a selection $\sigma_p(R_i) \in T(q), q \in W$ if $|\sigma_p(R_i)| > 0$ and $r = \lceil \log_b(|\sigma_p(R_i)|) \rceil$ and $|\sigma_p(R_i)| < \phi \cdot |R_i|$. For $|\sigma_p(R_i)| = 0$, $X^{idx}_{i,s,0}$ is incremented by 1.

FIG. 2E

Use Case 2 (Data Compression Advisor) Let $C_{i,j}$ be a set of compressed and uncompressed storage layouts for an attribute $A_{i,j} \in R_i$, $C^u_{i,j} \in C_{i,j}$ be the uncompressed storage layout, and $W_{crt} \subseteq W$ be the subset of (business) critical SQL statements in the workload, defined by the user. A data compression advisor proposes for each attribute $A_{i,j} \in \mathcal{A}(R_i)$ of each relation $R_i \in \mathcal{R}$ a physical storage layout $\bar{C}_{i,j} \in C_{i,j}$ such that the estimated execution time $\hat{\mathcal{E}}$ of a workload $W$ based on workload execution statistics $FStat$ is minimized, while for each critical SQL statement $q \in W_{crt}$, the estimated execution time $\hat{\mathcal{E}}$ does not exceed the estimated execution time $\hat{\mathcal{E}}$ without compression:

$$\arg\min_{\forall R_i \in \mathcal{R} \forall A_{i,j} \in \mathcal{A}(R_i) \bar{C}_{i,j} \in C_{i,j}} \hat{\mathcal{E}}(\{\bar{C}_{i,j} \mid 1 \leq i \leq n, 1 \leq j \leq m_i\}, W, FStat)$$

subject to $\forall q \in W_{crt}: \hat{\mathcal{E}}(\{\bar{C}_{i,j} \mid 1 \leq i \leq n, 1 \leq j \leq m_i\}, W, FStat)$
$\leq \hat{\mathcal{E}}(\{C^u_{i,j} \mid 1 \leq i \leq n, 1 \leq j \leq m_i\}, q, FStat).$

FIG. 5A

We define a workload $W$ as a multiset of SQL statements and $T(q)$ as the physical execution plan of a SQL statement $q \in W$. For a workload $W$, we define workload execution statistics $FStat$ that includes:

F2 (Data Compression Advisor): For each executed SQL statement $q \in W$, $FStat$ stores for each attribute $A_{i,j} \in R_i$ a pair $(s_{i,j}, r_{i,j})$, where $s_{i,j}$ is the number of rows in $A_{i,j}$ that were sequentially accessed by $q$ (e.g., by a selection $\sigma_p(R_i) \in T(q)$, where $p$ contains $A_{i,j}$), and $r_{i,j}$ is the number of rows that were randomly accessed in $A_{i,j}$ by $q$ (e.g., by a projection $\Pi_{A_{i,j}} \in T(q)$).

FIG. 5B

Access Counter 2 (Data Compression Advisor)
*Physical Accesses:* We consider the physical data accesses during execution of workload W.
*Access Type:* For each attribute $A_{i,j} \in R_i$, we create and maintain an integer counter $X^s_{i,j}$, which tracks the number of rows sequentially read, and an integer counter $X^r_{i,j}$, which tracks the number of rows randomly accessed.

FIG. 5C

| Workload | TPC-H | JCC-H | JOB |
|---|---|---|---|
| Precision | 100% precise | | |
| Memory Overhead | < 0.1% | < 0.1% | < 0.1% |
| Runtime Overhead | 4.7% | 8.3% | 9.1% |

FIG. 7A

Use Case 3 (Buffer Pool Size Advisor) *A buffer pool size advisor proposes a minimal buffer pool size $B \in \mathbb{N}$ such that the estimated execution time $\widehat{\mathcal{E}}$ of a workload W based on workload execution statistics FStat does not violate a given threshold SLA:*

$$\underset{B \in \mathbb{N}}{\arg\min} \; B \qquad \text{subject to} \quad \widehat{\mathcal{E}}(B, W, FStat) \leq SLA.$$

*We define a workload W as a multiset of SQL statements and T(q) as the physical execution plan of a SQL statement $q \in W$. For a workload W, we define workload execution statistics FStat that includes:*

F3 (Buffer Pool Size Advisor): *For each executed SQL statement $q \in W$, FStat stores the access frequency $f_{P_{i,j,u}}$ to each page $P_{i,j,u} \in \mathbb{P}_{i,j}, u \in [1, |\mathbb{P}_{i,j}|]$ (i.e., $P_{i,j,u}$ stores for a set of rows the values $R_i[rid].A_{t,j}$), where $\mathbb{P}_{i,j}$ is the set of all pages of $A_{t,j} \in R_i$.*

Access Counter 3 (Buffer Pool Size Advisor)

*Physical Accesses:* We consider the physical data accesses by the workload $W$. *Start/End Block Counting:* For each attribute $A_{i,j} \in R_i$, we create and maintain integer counters $X^P_{i,j,1}, \ldots, X^P_{i,j,v}, \ldots, X^P_{i,j,(w+1)}$. For physical accesses to pages in the range $[P_{i,j,v}, P_{i,j,w}]$, $P_{i,j,w} \in P_{i,j}$, counter $X^P_{i,j,v}$ is incremented by 1, and counter $X^P_{i,j,(w+1)}$ is decremented by 1. The access frequency $f_{P_{i,j,u}}$ for page $P_{i,j,u}$ is defined as $f_{P_{i,j,u}} = \sum_{v=1}^{u} X^P_{i,j,v}$.

FIG. 8C

| Workload | Naïve Block-Level Counting | | | First/Last Page Counting | | |
|---|---|---|---|---|---|---|
| | TPC-H | JCC-H | JOB | TPC-H | JCC-H | JOB |
| Precision | 100% precise | | | 100% precise | | |
| Memory Overhead | ≤ 0.2% | ≤ 0.2% | ≤ 0.2% | ≤ 0.2% | ≤ 0.2% | ≤ 0.2% |
| Runtime Overhead | 8.3% | 13.1% | 21.8% | 5.2% | 9.2% | 13.5% |

FIG. 10A

Use Case 4 (Table Partitioning Advisor) Let $\mathbb{S}_i$ be a set of range partitioning specifications for a relation $R_i \in \mathcal{R}$. A table partitioning advisor proposes a buffer pool size $B \in \mathbb{N}$, and for each relation $R_i \in \mathcal{R}$ a range-partitioning $S_i \in \mathbb{S}_i$ such that the buffer pool size $B$ is minimized, while the estimated execution time $\hat{\mathcal{E}}$ of workload $W$ with workload execution statistics FStat does not violate a maximum workload execution time SLA.

$$\underset{B \in \mathbb{N}, R_i \in \mathcal{R}, S_i \in \mathbb{S}_i}{\arg\min} B \quad \text{subject to } \hat{\mathcal{E}}(\{S_i \mid 1 \leq i \leq n\}, B, W, FStat) \leq SLA.$$

We define a workload $W$ as a multiset of SQL statements and $T(q)$ as the physical execution plan of a SQL statement $q \in W$. For a workload $W$, we define workload execution statistics FStat that includes:

F4 (Table Partitioning Advisor): For each executed SQL statement $q \in W$, FStat stores the access frequency $f_{v_{i,j,k}}$ for each value $v_{i,j,k} \in D(A_{i,j})$, where $f_{v_{i,j,k}}$ is the sum of

- the number of sequential reads of $A_{i,j}$ by $q$ such that $\exists R_i[rid_i].A_{i,j} = v_{i,j,k}, rid_i \in [1, |R_i|]$ that is part of the matching rows (e.g., by a selection $\sigma_p(e) \in T(q)$ where $p$ references $A_{i,j}$ and $v_{i,j,k}$ satisfy $p$)$^s$, and
- the number of random reads of rows in $A_{i,j}$ by $q$ such that $R_i[rid_i].A_{i,j} = v_{i,j,k}, \forall rid_i \in [1, |R_i|]$ (e.g., by a projection $\Pi_{A_{i,j}} \in T(q)$).

Access Counter 4 (Table Partitioning Advisor)

*Block Counting:* For each attribute $A_{i,j} \in R_i$, we create counters $X_{i,j,0}^{val}, \ldots, X_{i,j,b}^{val}, \ldots$, $X_{i,j,\lceil d_{i,j}/b_{i,j} \rceil}^{val}$, where the block size $b_{i,j}$ is the number of values grouped into a block.

*Stream-summary:* For each attribute $A_{i,j} \in R_i$, we create a stream-summary data structure $SS_{i,j}^h$ such that $D(SS_{i,j}^h)$ is the domain of the monitored top-h most frequently accessed values. For a value $v_{i,j,k}$, the estimated access frequency is given by $SS_{i,j}^h(v_{i,j,k})$ if $v_{i,j,k} \in D(SS_{i,j}^h)$, otherwise 0.

*Physical Accesses:* We consider the physical data accesses during execution of workload W. For a sequential read on $A_{i,j}$, $X_{i,j,b}^{val}$ is incremented by the number of values that fall into the given block and have at least one matching row. The values are also inserted into $SS_{i,j}^h$. For a random read $R_i[rid_t].A_{i,j} = v_{i,j,k}, rid_t \in [1, |R_i|], X_{i,j,\lceil k/b_{i,j} \rceil}^{val}$ is incremented by 1, and the value is inserted into $SS_{i,j}^h$.

FIG. 11C

Access Frequency: The estimated access frequency $\hat{f}_{v_{i,j,k}}$ is calculated as follows:

$$\hat{f}_{v_{i,j,k}} = \begin{cases} SS_{i,j}^h(v_{i,j,k}) & \text{if } isHH(v_{i,j,k}) \\ \left\lceil \left( X_{i,j,\lfloor k/b_{i,j}\rfloor}^{val} - numHHAccesses \right) / (b_{i,j} - numHH) \right\rceil & \text{otherwise,} \end{cases}$$

where $isHH(v_{i,j,k}) = \begin{cases} 1 & \text{if } v_{i,j,k} \in D(SS_{i,j}^h) \wedge SS_{i,j}^h(v_{i,j,k}) \leq \lambda \cdot X_{i,j,\lfloor k/b_{i,j}\rfloor}^{val} \\ 0 & \text{otherwise.} \end{cases}$ $numHH = \sum_{k'=\lfloor k/b_{i,j}\rfloor \cdot b_{i,j}}^{\lceil k/b_{i,j}\rceil \cdot b_{i,j} - 1} isHH(v_{i,j,k'})$ $numHHAccesses = \sum_{k'=\lfloor k/b_{i,j}\rfloor \cdot b_{i,j}}^{\lceil k/b_{i,j}\rceil \cdot b_{i,j} - 1} isHH(v_{i,j,k'}) \cdot SS_{i,j}^h(v_{i,j,k'}).$

FIG. 13

| Workload 1502 | Row-Level Counters 1506 | | | Value range counters 1508 | | | Combined approach w/ stream summary 1510 | | |
| --- | --- | --- | --- | --- | --- | --- | --- | --- | --- |
| | TPC-H | JCC-H | JOB | TPC-H | JCC-H | JOB | TPC-H | JCC-H | JOB |
| Memory Overhead | 10.80% | 10.82% | 20.53% | ≤1% | ≤1% | ≤1% | ≤1% | ≤1% | ≤1% |
| Runtime Overhead 1504 | 3.9% | 14.7% | 15.6% | 2.1% | 9.7% | 9.6% | 13.8% | 22.7% | 23.6% |

FIG. 15

| Approach for collecting workload execution statistics | Precise FStat | | | | Compact | Fast |
|---|---|---|---|---|---|---|
| | F1 | F2 | F3 | F4 | | |
| Row-level data access counters ⟵ 1704 | x | ✓ | ✓ | ✓ | x | x |
| Graph representation ⟵ 1706 | x | ✓ | ✓ | ✓ | ● | ● |
| Block-level data access counters ⟵ 1708 | x | ✓ | ✓ | ● | ✓ | ● |
| SQL statements + What-if API ⟵ 1710 | ● | ● | ● | ● | ✓ | x |
| Memory access tracing ⟵ 1712 | x | x | ✓ | ✓ | x | x |
| Improved Access Counters ⟵ 1702 | ✓ | ✓ | ✓ | ✓ | ✓ | ✓ |

✓ Requirement Met
x Requirement Not Met
● Requirement Partially Met

FIG. 17

IMPLEMENTATION OF DATA ACCESS METRICS FOR AUTOMATED PHYSICAL DATABASE DESIGN

CLAIM OF PRIORITY

This application claims priority under 35 USC § 120 to U.S. patent application Ser. No. 17/316,901 filed on May 11, 2021, titled "Improved Design and Implementation of Data Access Metrics for Automated Physical Database Design"; which claims priority under § 119(e) to U.S. Provisional Application Ser. No. 63/153,214, filed on Feb. 24, 2021, titled "Improved Design and Implementation of Data Access Metrics for Automated Physical Database Design"; of which the entire contents of both and together are hereby incorporated by reference.

TECHNICAL FIELD

The present disclosure relates to computer-implemented methods, software, and systems for improved design and implementation of data access metrics for automated physical database design.

BACKGROUND

A database system can be tuned using a number of configurable parameters. A database system can be tuned to adjust the database system to meet one or more particular requirements, desires, or goals of the customer using the database system. For example, a first customer may wish to have a first database system tuned to prioritize throughput and/or latency. As another example, a second customer may wish to have a second database system tuned to prioritize reduction of memory consumption. As yet another example, a third customer may wish to have a third database system tuned so as to reduce overall cost of ownership.

SUMMARY

The present disclosure involves systems, software, and computer implemented methods for improved design and implementation of data access metrics for automated physical database design. An example method includes: identifying a database workload for which index advisor access counters are to be tracked, wherein the database workload includes at least one SQL statement; executing each SQL statement in the database workload, wherein executing a respective SQL statement comprises: determining attribute sets of at least one free attribute for which a selection predicate filters a result for the SQL statement; determining an output cardinality of each selection predicate; determining, for each selection predicate, whether the output cardinality of the selection predicate is greater than a threshold; and in response to determining that the output cardinality of a respective selection predicate is not greater than the threshold: creating logarithmic counters for the selection predicate if logarithmic counters have not yet been created for the selection predicate; determining, based on the output cardinality of the selection predicate, a logarithmic counter for an attribute set corresponding to the selection predicate; and incrementing the logarithmic counter; and providing respective values for the logarithmic counters of the determined attributes to an index advisor, as the index advisor access counters.

Implementations may include one or more of the following features. The logarithmic counter can be selected from among a collection of logarithmic counters for the attribute set. Determining the logarithmic counter can include determining a collection index of a particular logarithmic counter in the collection of logarithmic counters for the attribute set. Determining the collection index can include determining the logarithm of the output cardinality of the selection predicate. Determining the logarithm of the output cardinality of the selection predicate can include: determining a current value of a configurable logarithm base parameter; and using the current value of the configurable logarithm base parameter when determining the logarithm of the output cardinality of the selection predicate. The threshold can be based on a maximum query result size. The logarithmic counters for an attribute set can be created in response to determining that an executed query includes a selection predicate for the attribute set. The index advisor can determine attribute sets for which to propose an index based on the logarithmic counters of the respective attribute sets.

Another example method includes: identifying a database workload for which data compression access counters are to be maintained; determining database attributes included in the workload; creating data compression access counters for the workload, including: creating a sequential access counter for each database attribute in the workload; and creating a random access counter for each database attribute in the workload; tracking memory access of each database attribute of the workload during execution of the workload, including: incrementing the sequential access counter for a respective database attribute in response to determining that a database row that includes the database attribute is sequentially read; and incrementing the random access counter for a respective database attribute in response to determining that a database row that includes the database attribute is randomly read; and providing respective values for the data compression access counters to a data compression advisor.

Implementations can include one or more of the following features. The data compression advisor can determine, for each database attribute of the database workload, whether to propose data compression for the database attribute, based on the respective values for the data compression access counters for the database attribute. Determining whether to propose data compression for a first database attribute can include: determining an estimated execution time for the database workload if the first database attribute is compressed; determining an estimated execution time for the database workload if the first database attribute is not compressed; and determining to propose data compression for the first database attribute in response to determining that the estimated execution time for the database workload if the first database attribute is compressed is less than the estimated execution time for the database workload if the first database attribute is not compressed. Determining whether to propose data compression for a first database attribute can include: comparing the value of the sequential access counter for the first database attribute to the value of the random access counter for the first database attribute; and determining whether to propose data compression for the first database attribute based on comparing the value of the sequential access counter for the first database attribute to the value of the random access counter for the first database attribute. Determining whether to propose data compression for the first database attribute based on comparing the value of the sequential access counter for the first database attribute to the value of the random access counter for the first database attribute can include determining whether the value of the sequential access counter for the first database attribute is substantially larger than the value of the random access counter for the first database attribute. Determining whether the value of the sequential access counter for the first database attribute is substantially larger than the value of the random access counter for the first database attribute can include: identifying a rule that defines when a value of a sequential access counter for a database attribute is substantially larger than a value of a corresponding random access counter for the database attribute; and evaluating the rule with respect to the first database attribute to determine whether the value of the sequential access counter for the first database attribute is substantially larger than the value of the random access counter for the first database attribute. A first rule can specify that a value of a sequential access counter for a database attribute is substantially larger than a value of a corresponding random access counter for the database attribute when a ratio of the value of the sequential access counter for the database attribute to the value of the corresponding random access counter for the database attribute is more than a predetermined threshold.

Another example method includes: identifying a database workload for which page access counters are to be tracked, wherein the database workload includes at least one SQL statement; executing each SQL statement in the database workload, wherein executing a respective SQL statement comprises accessing attribute values for at least one attribute when executing the SQL statement; for each attribute for which attribute values are accessed: determining a page range of at least one page that is accessed when accessing attribute values for the attribute for a query execution, wherein the page range is defined by a starting page and an ending page and wherein each page in the page range has a page index corresponding to the page; for each attribute value access of the attribute, incrementing a first page access counter in a collection of page access counters, wherein the first page access counter has a first index corresponding to the page index of the starting page; and decrementing a second page access counter in the collection of page access counters, wherein the second page access counter has a second index corresponding to a value equal to one more than the page index of the ending page; determining page access frequencies based on the page access counters; and providing the page access frequencies to a buffer pool size advisor.

Implementations can include one or more of the following features. The workload can include a first SQL statement that includes a filter predicate on a first attribute. Executing the first SQL statement can include performing a sequential scan of all pages that include attribute values for the first attribute to determine which attribute values match the filter predicate. The starting page of the page range can be a first page accessed during the sequential scan and the ending page of the page range can be a last page accessed during the sequential scan. The workload can include a second SQL statement. Executing the second SQL statement can include randomly accessing a first page to retrieve a first attribute value for a first attribute. The page range can include the first page that was randomly accessed during execution of the second SQL statement. The starting page of the page range can be the first page and the ending page of the page range can be the first page. Determining the page access frequencies based on the page access counters comprises determining the page access frequency for a first page by calculating a sum of the page access counter of the first page and page access counters of pages that precede the page access counter of the first page in the collection of page access counters. The buffer pool size advisor can use the page access frequencies to determine a buffer pool size for the workload.

Another example method includes: identifying a database workload for which attribute value frequency counters are to be tracked, wherein the database workload includes at least one SQL (Structured Query Language) statement; executing each SQL statement in the database workload, wherein executing a respective SQL statement comprises: determining attribute values of attributes that are accessed when executing the SQL statement; and for each attribute for which at least one attribute value is accessed: maintaining value range counters for the attribute that track counts of attribute value accesses within respective value ranges; maintaining a stream-summary data structure for the attribute that estimates access frequencies of most frequently accessed attribute values of the attribute; and determining estimated access frequencies for the attribute values of the attribute using the value range counters for the attribute and the stream summary data structure for the attribute; and providing the estimated access frequencies for the attribute values of the attributes to a table partitioning advisor, as the attribute value frequency counters.

Implementations can include one or more of the following features. The stream-summary data structure for the attribute can include estimated access frequencies for a predetermined number of most frequently accessed attribute values for the attribute. Maintaining value range counters for the attribute can include, for a first access of a first attribute value of a first attribute: determining a first value range for the first attribute that includes the first attribute value, from among a collection of value ranges for the first attribute; and incrementing a first value range counter for the first value range, in response to the first access of the first attribute value. Each value range in the collection of value ranges for the first attribute can have a predefined value range size that indicates how many attribute values of a domain of attribute values for the first attribute are included in each value range. Determining estimated access frequencies for the attribute values of the attribute using the value range counters for the attribute and the stream summary data structure for the attribute can include determining, for each of the attribute values of the attribute in the stream-summary data structure, whether the estimated access frequency of the attribute value in the stream-summary data structure is a valid estimated access frequency of a most frequently accessed attribute value. Determining whether the estimated access frequency of the attribute value in the stream-summary data structure is a valid estimated access frequency of a most frequently accessed attribute value can include determining whether the estimated access frequency of the attribute value in the stream-summary data structure is significantly larger than a corresponding value range counter for the attribute value in the stream-summary data structure. Determining whether the estimated access frequency of the attribute value in the stream-summary data structure is significantly larger than corresponding value range counter for the attribute value in the stream-summary data structure can include determining whether the estimated access frequency of the attribute value in the stream-summary data structure is larger than a product of the corresponding value range counter for the attribute value in the stream-summary data structure and a predetermined tolerance parameter. Determining estimated access frequencies for the attribute values of the attribute using the value range counters for the attribute and the stream summary data structure for the attribute can include determining whether a first value range includes an attribute value with a valid estimated access frequency of a most frequently accessed attribute value in the stream summary data structure. In response to determining that the first value range does not include an attribute value with a valid estimated access frequency of a most frequently accessed attribute value in the stream summary data structure, for each attribute value in the first value range, an estimated access frequency of the attribute value in the first value range can be determined by dividing a first value range counter of the first value range by the predetermined value range size. In response to determining that the first value range includes a first attribute value with a valid estimated access frequency of a most frequently accessed attribute value in the stream summary data structure: 1) an adjusted value range counter for the first value range can be determined by subtracting the valid estimated access frequency of the first attribute value from a value range counter for the first value range; and 2) for each attribute value in the first value range other than the first value: an estimated access frequency of the attribute value in the first value range can be determined by dividing the adjusted value range counter by the predetermined value range size; and a determination can be made that an estimated access frequency of the first attribute value is equal to the valid estimated access frequency of the first attribute value. Value-range based frequency estimates can be determined for the attribute values that are included in the first value range and the value-range based frequency estimates can be provided to the table partitioning advisor as the attribute value frequency counters for the attribute values that are included in the first value range. Determining value-range based frequency estimates for the attribute values that are included in the first value range can include dividing the first value range counter by the predetermined value range size. The table partitioning advisor can determine one or more table partitioning criteria based on the estimated access frequencies for the attribute values of the attributes.

While generally described as computer-implemented software embodied on tangible media that processes and transforms the respective data, some or all of the aspects may be computer-implemented methods or further included in respective systems or other devices for performing this described functionality. The details of these and other aspects and embodiments of the present disclosure are set forth in the accompanying drawings and the description below. Other features, objects, and advantages of the disclosure will be apparent from the description and drawings, and from the claims.

DESCRIPTION OF DRAWINGS

FIG. 5A illustrates a use case definition for a data compression advisor.

FIG. 5B illustrates a formal definition of workload execution statistics for a data compression advisor.

FIG. 5C illustrates a data structure definition describing workload execution statistics for a data compression advisor.

FIG. 7A illustrates evaluation results for access counters for a data compression advisor.

FIG. 8A illustrates a use case definition for a buffer pool size advisor.

FIG. 8B illustrates a formal definition of workload execution statistics for a buffer pool size advisor.

FIG. 8C illustrates a data structure definition describing workload execution statistics for a buffer pool size advisor.

FIG. 10A illustrates evaluation results for workload execution statistics for a buffer pool size advisor.

FIG. 11A illustrates a use case definition for a table partitioning advisor.

FIG. 11B illustrates a formal definition of workload execution statistics for a table partitioning advisor.

FIG. 11C illustrates a data structure definition describing workload execution statistics for a table partitioning advisor.

FIG. 13 illustrates formulas for access frequency calculations for a table partitioning advisor.

FIGS. 14 and 15 illustrate evaluation results for workload execution statistics for a table partitioning advisor.

FIG. 17 is a table that illustrates a comparison of different approaches for collecting workload execution statistics.

DETAILED DESCRIPTION

Figure 1:
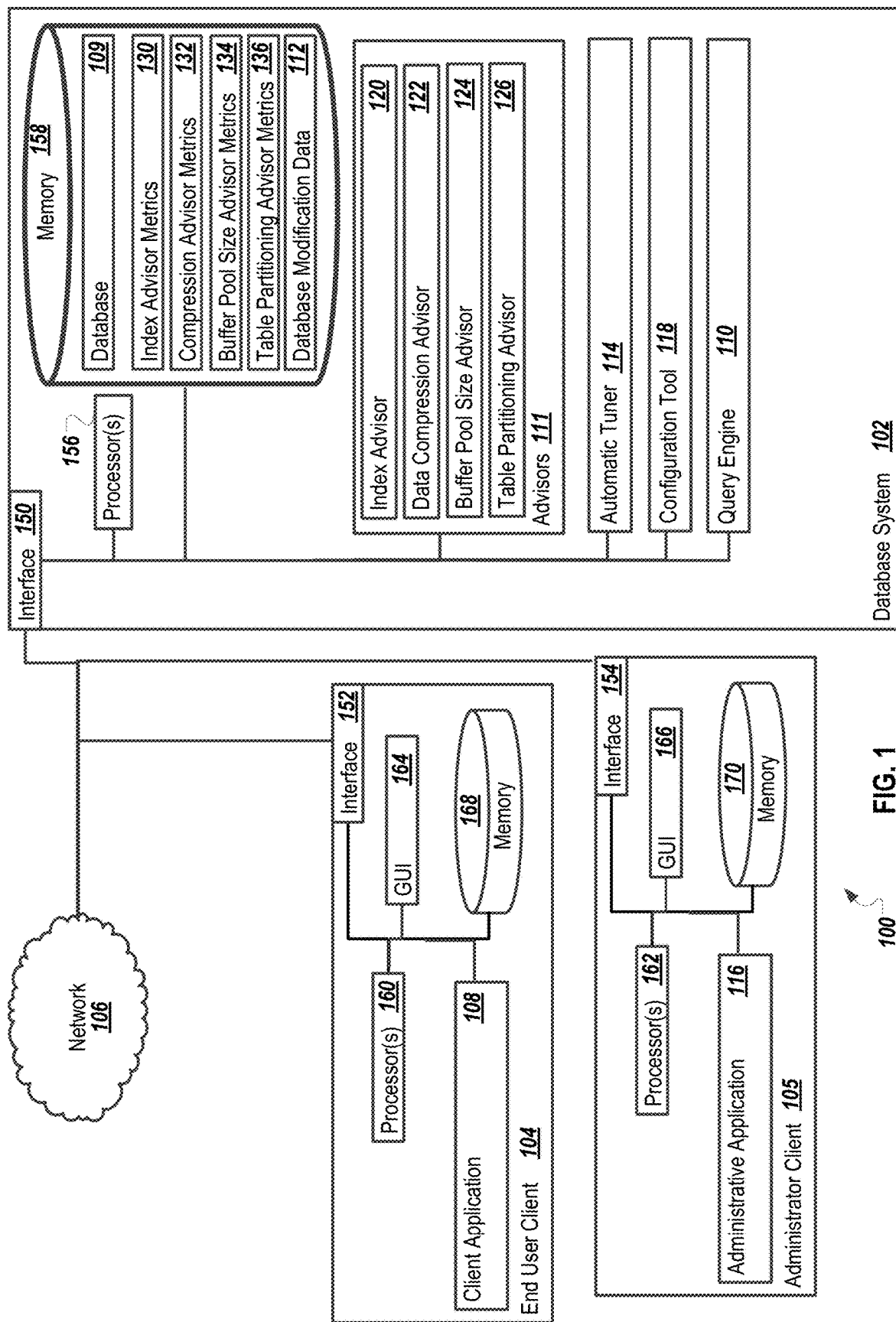
FIG. 1 is a block diagram illustrating an example system for improved design and implementation of data access metrics for automated physical database design.

Manual tuning by database experts can be a complicated and expensive process. As an alternative to manual tuning, automated advisor tools can be used to automate physical database tuning. The effectiveness of the advisor tools can depend on the availability of accurate workload execution statistics about an executed database workload.

There is generally a trade-off between the accuracy of workload execution statistics and corresponding runtime and memory overhead. Preferably, workload execution statistics are collected with low runtime and memory overhead, such that the advisor tools can be executed online to adapt to dynamic applications with unpredictable workloads. However, in prior systems, workload execution statistics are either gathered offline (e.g., by executing a representative sample of the workload on a separate node) or collected online but with low precision (e.g., by tracking access frequencies at page granularity instead of per row and attribute, along with sampling techniques). Accordingly, prior approaches do not result in precise, compact, and fast collection of workload execution statistics for advisor tools.

The improved approach described below provides workload execution statistics which are precise (e.g., in terms of accuracy), compact (e.g., in terms of a ratio of a memory footprint compared to a data set size), and fast (e.g., in terms of runtime processing overhead during workload execution), as compared to other approaches. The collected workload execution statistics can be provided for configuring the physical database, including by automated tools.

Automated physical database design tools can be categorized according to an objective function, such as maximum performance, minimum memory footprint, or minimum of overall cost of ownership. For example, index advisors and data compression advisors can advise on in-memory performance (e.g., speeding up query response times of given workloads). As another example, buffer pool size advisors and table partitioning advisors can be configured to attempt to reduce a memory footprint or overall cost of ownership. Additionally, advisor tools can fulfill specified constraints such as a memory budget or a maximum workload execution time.

Advisor tools can consider a set of potential new physical layout alternatives. For each alternative, the advisor can calculate a change in an objective function based on the data, the workload, and the current physical layout. Accurate statistics about the executed workload are of particular importance for the effectiveness of advisor tools. For example, index advisors can rely on detailed knowledge of query predicate selections, data compression advisors can be based on information regarding how much data is sequentially read (e.g., using scans) or randomly accessed (e.g., using an index join), buffer pool size advisors can be based on page access statistics, and table partitioning advisors can be based on row-level or value-level access statistics.

FIG. 1 is a block diagram illustrating an example system 100 for improved design and implementation of data access metrics for automated physical database design. Specifically, the illustrated system 100 includes or is communicably coupled with a database system 102, an end-user client device 104, an administrator client device 105, and a network 106. Although shown separately, in some implementations, functionality of two or more systems or servers may be provided by a single system or server. In some implementations, the functionality of one illustrated system, server, or component may be provided by multiple systems, servers, or components, respectively.

An end user can use an application 108 to submit queries to the database system 102, for data in a database 109. A query engine 110 can execute client queries to obtain query results that include data from the database 109 and return the query results to the end-user client device 104, for presentation in the client application 108. The database system 102 may include a set of advisors 111 that can generate database modification data 112 that describes recommended modifications for tuning the database system 102. In some implementations, the modifications can be automatically applied by an automatic tuner 114 (or by a particular advisor in the set of advisors 111). As another example, an administrator can use an administrative application 116 to manually review the modifications and request or configure at least some of the modifications using a configuration tool 118, for example.

The advisors 111 include an index advisor 120, a data compression advisor 122, a buffer pool size advisor 124, and a table partitioning advisor 126, that generate and collect index advisor metrics 130, compression advisor metrics 132, buffer pool size advisor metrics 134, and table partitioning advisor metrics 136, respectively. Respective metrics may be stored in the database 109 or in one or more other data repositories.

The index advisor 120 can track actual output cardinalities of selections at query execution time to provide precise cardinality estimates. The index advisor 120 may recommend single and/or multi-column indexes by using "lazy" counters (e.g., to meet memory requirements) that are only created and incremented if a corresponding combination of attributes actually occurs in selection predicates and if a selection in the workload has an output cardinality below a certain threshold that consists of the corresponding combination of attributes. The index advisor 120 can group actual output cardinalities into intervals and count a number of selections per interval. Similar metrics can be created for join operations. The index advisor 120 can provide improvements (e.g., with regards to preciseness, compactness, and speed), as compared to other approaches that provide workload execution statistics by considering SQL statements as input to what-if analyses. The other approaches can be limited in performance due to the what-if analyses and a relying on an availability of precise cardinality estimates.

The data compression advisor 122 can generate the compression advisor metrics 132 by counting both the number of rows accessed sequentially and the number of rows accessed randomly, to track both sequential and random types of access. Maintaining two types of counters per attribute can fulfill a space efficiency requirement. Additionally, determining metrics for both sequential and random access can result in improved compression layout modification recommendations, as compared to other approaches of collecting workload execution statistics by other data compression advisors that do not consider the type of access (e.g., sequential or random access).

The buffer pool size advisor 124 can generate the buffer pool size advisor metrics 134 by using an approach of only updating respective start and end page counters. Such an approach can enable counter updates in constant time, as compared to non-constant time that may result from other approaches that update all block counters of accesses that span multiple pages. For example, a worst case for the other approaches, for an access that spans multiple pages, may result in an updating of all block counters.

The table partitioning advisor 126 can generate the table partitioning advisor metrics 136 using both block access data (e.g., data accesses collected by block counters) and stream-summary data (e.g., data accesses collected by a stream-summary data structure). The block access data collects accesses per value range and the stream-summary data collects frequently-accessed values for all value ranges. The table partitioning advisor 126 can combine the block access data and the stream-summary data to generate precise statistics, especially when accesses are heavily skewed inside of a value range The table partitioning advisor metrics 136 can be improved from other approaches since other types of calculated access frequencies can be imprecise due to being skewed access patterns. For example, other approaches of tracking access frequencies of values in an active attribute domain can group values into value ranges and increment a value range counter by one whenever a value or sub-range of the value range is read. The value range counter maintained by the other approaches represents the access frequency of each value in the range, and therefore frequencies generated by the other approaches can be substantially overestimated (thus not fulfilling a precision requirement).

As used in the present disclosure, the term "computer" is intended to encompass any suitable processing device. For example, although FIG. 1 illustrates a single database system 102, a single end-user client device 104, and an administrator client device 105, the system 100 can be implemented using a single, stand-alone computing device, two or more servers 102, or multiple client devices. Indeed, the database system 102 and the client devices 104 and 105 may be any computer or processing device such as, for example, a blade server, general-purpose personal computer (PC), Mac®, workstation, UNIX-based workstation, or any other suitable device. In other words, the present disclosure contemplates computers other than general purpose computers, as well as computers without conventional operating systems. Further, the database system 102 and the client devices 104 and 105 may be adapted to execute any operating system, including Linux, UNIX, Windows, Mac OS®, Java™, Android™, iOS or any other suitable operating system. According to one implementation, the database system 102 may also include or be communicably coupled with an e-mail server, a Web server, a caching server, a streaming data server, and/or other suitable server.

Interfaces 150, 152, and 154 are used by the database system 102, the end-user client device 104, and the administrator client device 105, respectively, for communicating with other systems in a distributed environment—including within the system 100—connected to the network 106. Generally, the interfaces 150, 152, and 154 each comprise logic encoded in software and/or hardware in a suitable combination and operable to communicate with the network 106. More specifically, the interfaces 150, 152, and 154 may each comprise software supporting one or more communication protocols associated with communications such that the network 106 or interface's hardware is operable to communicate physical signals within and outside of the illustrated system 100.

The database system 102 includes one or more processors 156. Each processor 156 may be a central processing unit (CPU), a blade, an application specific integrated circuit (ASIC), a field-programmable gate array (FPGA), or another suitable component. Generally, each processor 156 executes instructions and manipulates data to perform the operations of the database system 102. Specifically, each processor 156 executes the functionality required to receive and respond to requests from the end-user client device 104, for example.

Regardless of the particular implementation, "software" may include computer-readable instructions, firmware, wired and/or programmed hardware, or any combination thereof on a tangible medium (transitory or non-transitory, as appropriate) operable when executed to perform at least the processes and operations described herein. Indeed, each software component may be fully or partially written or described in any appropriate computer language including C, C++, Java™, JavaScript®, Visual Basic, assembler, Perl®, any suitable version of 4GL, as well as others. While portions of the software illustrated in FIG. 1 are shown as individual modules that implement the various features and functionality through various objects, methods, or other processes, the software may instead include a number of sub-modules, third-party services, components, libraries, and such, as appropriate. Conversely, the features and functionality of various components can be combined into single components as appropriate.

The database system 102 includes memory 158. In some implementations, the database system 102 includes multiple memories. The memory 158 may include any type of memory or database module and may take the form of volatile and/or non-volatile memory including, without limitation, magnetic media, optical media, random access memory (RAM), read-only memory (ROM), removable media, or any other suitable local or remote memory component. The memory 158 may store various objects or data, including caches, classes, frameworks, applications, backup data, business objects, jobs, web pages, web page templates, database tables, database queries, repositories storing business and/or dynamic information, and any other appropriate information including any parameters, variables, algorithms, instructions, rules, constraints, or references thereto associated with the purposes of the database system 102.

The end-user client device 104 and the administrator client device 105 may each generally be any computing device operable to connect to or communicate with the database system 102 via the network 106 using a wireline or wireless connection. In general, the end-user client device 104 and the administrator client device 105 each comprise an electronic computer device operable to receive, transmit, process, and store any appropriate data associated with the system 100 of FIG. 1. The end-user client device 104 and the administrator client device 105 can each include one or more client applications, including the client application 108 or the administrative application 116, respectively. A client application is any type of application that allows the end-user client device 104 or the administrator client device 105 to request and view content on a respective client device. In some implementations, a client application can use parameters, metadata, and other information received at launch to access a particular set of data from the database system 102. In some instances, a client application may be an agent or client-side version of the one or more enterprise applications running on an enterprise server (not shown).

The client device 104 and the administrator client device 105 respectively include processor(s) 160 or processor(s) 162. Each processor 160 or 162 included in the end-user client device 104 or the administrator client device 105 may be a central processing unit (CPU), an application specific integrated circuit (ASIC), a field-programmable gate array (FPGA), or another suitable component. Generally, each processor 160 or 162 included in the end-user client device 104 or the administrator client device 105 executes instructions and manipulates data to perform the operations of the end-user client device 104 or the administrator client device 105, respectively. Specifically, each processor 160 or 162 included in the end-user client device 104 or the administrator client device 105 executes the functionality required to send requests to the database system 102 and to receive and process responses from the database system 102.

The end-user client device 104 and the administrator client device 105 are each generally intended to encompass any client computing device such as a laptop/notebook computer, wireless data port, smart phone, personal data assistant (PDA), tablet computing device, one or more processors within these devices, or any other suitable processing device. For example, the end-user client device 104 and/or the administrator client device 105 may comprise a computer that includes an input device, such as a keypad, touch screen, or other device that can accept user information, and an output device that conveys information associated with the operation of the database system 102, or the respective client device itself, including digital data, visual information, or the GUI 164 or a GUI 166, respectively.

The GUIs 164 and 166 interface with at least a portion of the system 100 for any suitable purpose, including generating a visual representation of the client application 108 or the administrative application 116, respectively. In particular, the GUI 164 and/or the GUI 166 may be used to view and navigate various Web pages. Generally, the GUI 164 and the GUI 166 provide a respective user with an efficient and user-friendly presentation of business data provided by or communicated within the system. The GUI 164 and the GUI 166 may each comprise a plurality of customizable frames or views having interactive fields, pull-down lists, and buttons operated by the user. The GUI 164 and the GUI 166 each contemplate any suitable graphical user interface, such as a combination of a generic web browser, intelligent engine, and command line interface (CLI) that processes information and efficiently presents the results to the user visually.

Memory 168 and memory 170 included in the end-user client device 104 or the administrator client device 105, respectively, may each include any memory or database module and may take the form of volatile or non-volatile memory including, without limitation, magnetic media, optical media, random access memory (RAM), read-only memory (ROM), removable media, or any other suitable local or remote memory component. The memory 168 and the memory 170 may each store various objects or data, including user selections, caches, classes, frameworks, applications, backup data, business objects, jobs, web pages, web page templates, database tables, repositories storing business and/or dynamic information, and any other appropriate information including any parameters, variables, algorithms, instructions, rules, constraints, or references thereto associated with the purposes of the associated client device.

There may be any number of end-user client devices 104 and/or administrator client devices 105 associated with, or external to, the system 100. For example, while the illustrated system 100 includes one end-user client device 104, alternative implementations of the system 100 may include multiple end-user client devices 104 communicably coupled to the database system 102 and/or the network 106, or any other number suitable to the purposes of the system 100. Additionally, there may also be one or more additional end-user client devices 104 external to the illustrated portion of system 100 that are capable of interacting with the system 100 via the network 106. Further, the term "client", "client device" and "user" may be used interchangeably as appropriate without departing from the scope of this disclosure. Moreover, while the end-user client device 104 and the administrator client device 105 may be described in terms of being used by a single user, this disclosure contemplates that many users may use one computer, or that one user may use multiple computers.

Figure 2:
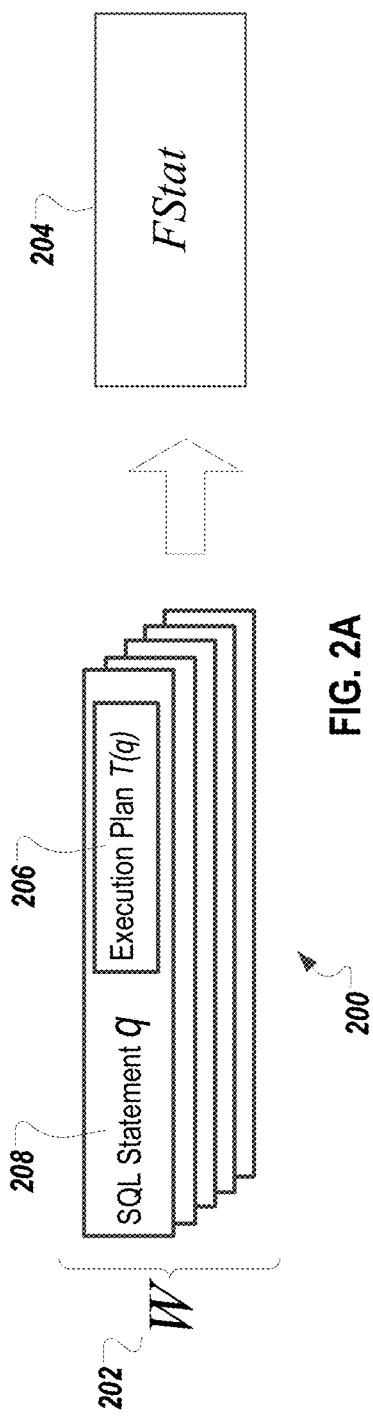
FIG. 2A is a diagram that illustrates a workload and workload execution statistics.
FIG. 2B illustrates a use case definition for an index advisor.
FIG. 2C illustrates a formal definition of workload execution statistics for an index advisor.
FIG. 2D illustrates example workload execution statistics for an index advisor.
FIG. 2E illustrates a data structure definition describing workload execution statistics for an index advisor.

FIG. 2A is a diagram 200 that illustrates a workload W 202 and workload execution statistics FStat 204. The workload W 202 can be defined, for example, as a multiset of SQL (Structured Query Language) statements. The workload execution statistics FStat 204 are statistics about W collected during the execution of W. An execution plan T(q) 206 can be defined as a physical execution plan of a particular SQL statement q 208, with q∈W. Although SQL statements are described, the described workload execution statistic generation approaches for the different advisors can be applied more generally to other environments that include other types of data read and data write statements, including non SQL environments.

Various use cases of automated physical database design advice can be identified that use the workload execution statistics FStat 204 about the workload W 202. For example and as described in more detail below, four practical use cases of automated physical database design advice that require workload execution statistics as input include an index advisor, a data compression advisor, a buffer pool size advisor, and a table partitioning advisor. Each use case can be formally defined, as described below, and for each use case, particular workload execution statistics FStat 204 can be defined. When defining the automated physical database design use cases and corresponding statistics, $\mathcal{R}$ denotes a set of n relations, and $A(R_i)$ is the set of $m_i$ attributes of relation $R_i \in \mathcal{R}$. Further, $D(A_{i,j}) = \{v_{i,j,1}, \ldots, v_{i,j,k} \ldots v_{i,j,d_{i,j}}\}$ refers to the active domain of attribute $A_{i,j} \in \mathcal{A}(R_i)$ with $v_{i,j,1} < \ldots < v_{i,j,k} < \ldots < v_{i,j,d_{i,j}}$, where $d_{i,j}$ is the number of distinct values in $A_{i,j}$. Finally, $R_i[rid_i]. A_{i,j} \in D(A_{i,j})$ is the value of the row with row id $rid_i \in [1, |R_i|]$ of attribute $A_{i,j} \in \mathcal{A}(R_i)$, where $|R_i|$ is the cardinality of $R_i \in \mathcal{R}$.

FIG. 2B illustrates a use case definition 240 for an index advisor. Creating a clustered index on a column can improve database performance when a workload includes selective filter predicates. Traversing an index is faster than performing a full column scan for selective filter predicates, for example. A memory budget can be allocated for index creation. An index advisor can be configured to provide information so that indexes are created for attributes, if indexed, yield a largest performance benefit. The use case definition 240 includes an index configuration IC 244 that can be proposed by an index advisor such that an estimated execution time 244 of a workload W 246 based on workload execution statistics FStat 248 is minimized while an estimated additional memory consumption 250 of the indexes adheres to a specified memory budget MB 252.

FIG. 2C illustrates a formal definition 260 of workload execution statistics for an index advisor. The formal definition 260 defines FStat F1 262 as including, for each SQL statement q in a workload W 264, exact output cardinalities $|\sigma_p(R_i)|$ 266 together with its free attributes $\mathcal{F}(p)$ of all selections $\sigma_p(R_i)$ 268 with an "index-SARGable" (index Search ARGument able) predicate p in a physical execution plan of the SQL statement q.

FIG. 2D illustrates example workload execution statistics 280 for an index advisor. The workload execution statistics 280 include an output cardinality 282 of 3,744,696 for an O_ORDERDATE attribute 284 and an output cardinality 286 of 299,496 for a C_MKTSEGMENT attribute 288. An index advisor can determine whether to create an index for a given attribute (or combination of attributes) based on output cardinalities. For example, the index advisor may determine to create an index for the C_MKTSEGMENT attribute 288 when the output cardinality 286 is less than a threshold. As another example, the index advisor may determine to not create an index for the C_MKTSEGMENT attribute 288 if the output cardinality 286 is greater than a threshold (e.g., the threshold can be a predetermined percentage, such as 10%, of the number of C_MKTSEGMENT values).

FIG. 2E illustrates a data structure definition 290 describing workload execution statistics for an index advisor. Prior approaches of providing workload execution statistics for index advisors may consider SQL statements as input to an optimizer's what-if API. However, those prior approaches are limited in performance due to what-if analysis and reliance on the availability of precise cardinality estimates. To address these limitations, actual output cardinalities of selections $\sigma_p(R_i)$ 292 that include index-SARGable predicates can be tracked at query execution time. Tracking the exact output cardinalities $|\sigma_p(R_i)|$ 294 of all selections may lead to issues regarding too much memory consumption. To address memory consumption concerns, lazy counters 295 and interval counting 296 can be used. In further detail, a threshold parameter $\phi \in (0,1]$ 297 can be introduced to capture only selections with an output cardinality less than $\phi \cdot |R_i|$ since, generally, only selective predicates substantially benefit from indexes (and for non-selective predicates, generating an index can actually hurt performance). To further reduce memory overhead, the actual output cardinalities can be grouped using a base parameter b into intervals $[b^r, b^{r+1})$, $b \in \mathbb{R}_{>0}$, $0 \leq r \leq \lceil \log_b(\phi \cdot |R_i|) \rceil$ and the number of selections per interval can be counted. The estimated output cardinality for selections that are recorded to the interval $[b^r, b^{r+1})$ is a value of $\sqrt{b^r \cdot b^{r+1}}$. Accordingly, an error (e.g., the ratio between the actual and estimated output cardinality) of $\sqrt{b}$ for arbitrary complex predicates can be determined. As an example, the interval base parameter b can be set to 2, such that the actual and estimated output cardinalities differ at most by a factor of $\sqrt{2}$.

Since an index advisor may recommend multi-column indexes, one set of intervals (i.e., $[b^r, b^{r+1})$, $b \in \mathbb{R}_{>0}$, $0 \leq r \leq \lceil \log_b(\phi \cdot |R_i|) \rceil$) per combination of free attributes per relation can be used (e.g., in total, a size of $2^{m_i}-1 (=|\mathcal{P}(\mathcal{A}(R_i)) \setminus \{ \}|)$ set of intervals), where $\mathcal{P}(\mathcal{A}(R_i))$ represents the power set of attributes. As a result, the memory consumption using 32-bit counters for a relation $R_i$ with $m_i$ attributes can be $((\lceil \log_b(\phi \cdot |R_i|) \rceil + 1) \cdot (2^{m_i}-1) \cdot 4)$ bytes. To meet memory requirements, lazy counters can be used that are only created if (1) the corresponding combination of free attributes actually occurs in selection predicates and (2) the output cardinality of at least one selection containing the corresponding combination of free attributes is less than $\phi \cdot |R_i|$. Accordingly, the number of attribute combinations for which lazy counters are created is significantly smaller than the number of all attribute combinations. For instance, for an example LINEITEM data set with a scale factor 10 (i.e., 16 attributes and 60,000,000 rows) and b=2, counters for all combinations of free attributes constitute 0.32% of the data set size of the LINEITEM data set (1.90 GB), while lazy counters constitute only 0.02% of the data set size.

Figure 3:
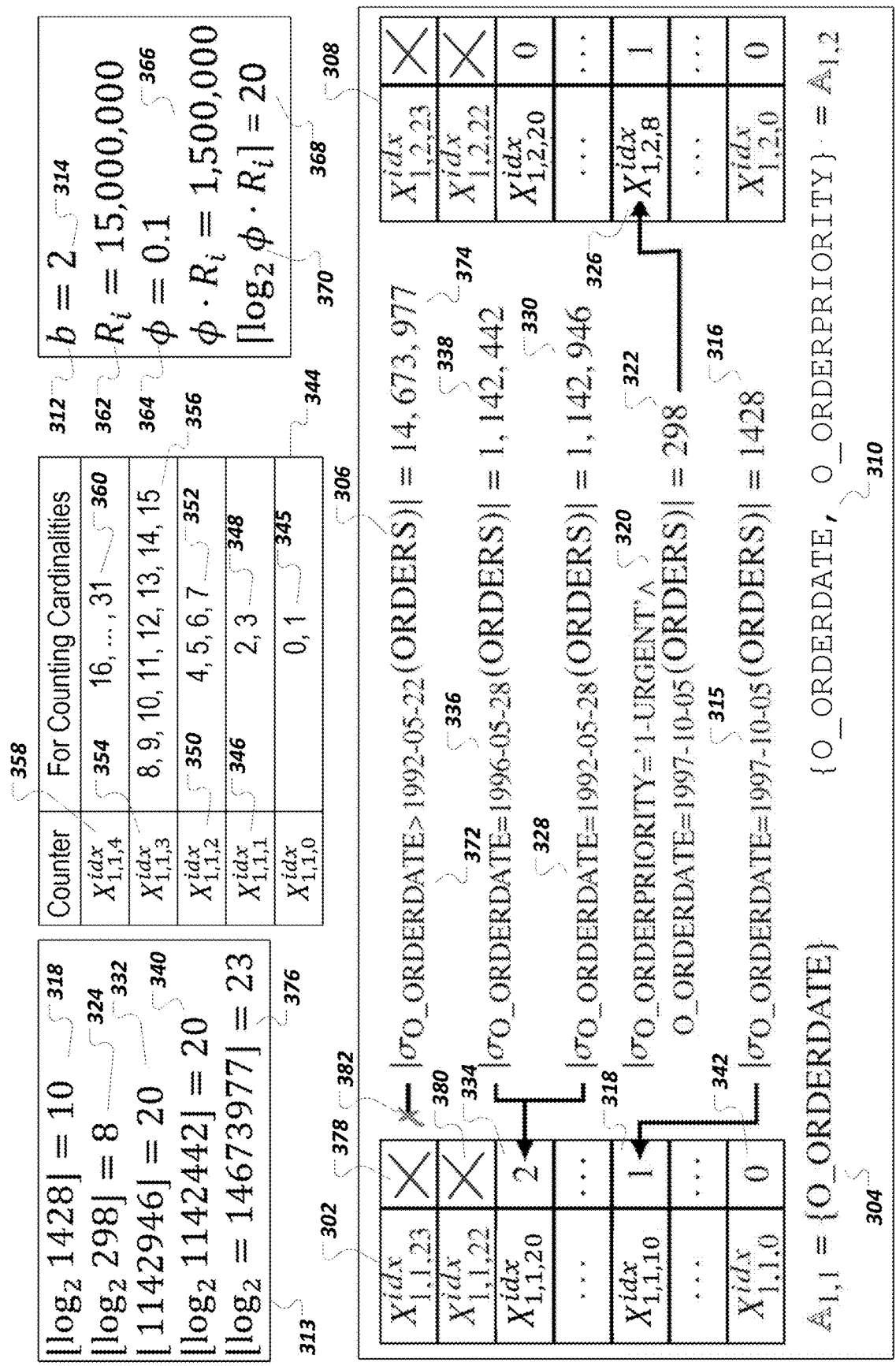
FIG. 3 is an illustration of determining workload execution statistics for an index advisor for an example workload.

FIG. 3 is an illustration 300 of determining workload execution statistics for an index advisor for an example workload. For each attribute of each relation included in the workload, workload execution statistics are tracked at query execution time based on output cardinalities of selections that include a filter predicate including one or more attributes. For example, workload execution statistics $X_{1,1,r}^{idx}$ 302 are tracked for an O_ORDERDATE attribute 304 for an ORDERS table 306 and workload execution statistics $X_{1,2,j}^{idx}$ 308 are tracked for an O_ORDERDATE and O_ORDERPRIORITY attribute combination 310 for the ORDERS table 306.

The workload execution statistics 302 and 308 can include logarithmic counters as part of a logarithmic counting approach to reduce a number of counters, as compared to using a counter for every output cardinality that occurs at runtime for an attribute. Logarithmic counting can be based on a base parameter b 312. The example of FIG. 3 uses a parameter value of two 314 for the base parameter b 312. Logarithmic counting can include calculating a log base b value of the output cardinality of each selection (e.g., $\log_b |\sigma_p(R_i)|$) to determine which logarithmic counter to increment. Examples are discussed below with respect to equations 313 that illustrate intermediate calculations.

For example, a selection 315 results in an output cardinality 316 of 1,428. An equation 318 indicates that $\lfloor \log_2 1428 \rfloor = 10$. Accordingly, a logarithmic counter $X_{1,1,10}^{idx}$ 318 (e.g. at an index of 10 in an array of logarithmic counters) is incremented for the O_ORDERDATE attribute 304. As another example, a selection 320 results in an output cardinality 322 of 298. An equation 324 indicates that $\lfloor \log_2 298 \rfloor = 8$. Accordingly, a logarithmic counter $X_{1,2,8}^{idx}$ 326 is incremented for the O_ORDERDATE and O_ORDERPRIORITY attribute combination 310.

Different selections can result in an incrementing of a same logarithmic counter. For example, a selection 328 results in an output cardinality 330 of 1,142,946. An equation 332 indicates that $\lfloor \log_2 1142946 \rfloor = 20$. Accordingly, a logarithmic counter $X_{1,1,20}^{idx}$ 334 is incremented for the O_ORDERDATE attribute 304. A selection 336 results in an output cardinality 338 of 1,142,442. An equation 340 indicates that $\lfloor \log_2 1142442 \rfloor$ also equals 20. Accordingly, the logarithmic counter $X_{1,1,20}^{idx}$ 334 is incremented again for the O_ORDERDATE attribute 304.

The logarithmic counters for an attribute are configured such that lower indexed logarithmic counters in the array of counters for the attribute (e.g., a logarithmic counter $X_{1,1,0}^{idx}$ 342) are used to counter fewer output cardinality values than higher indexed logarithmic counters (e.g., the logarithmic counter $X_{1,1,20}^{idx}$ 334). A table 344 illustrates which output cardinality values can be counted by the lowest-indexed logarithmic counters included in the workload execution statistics 302. The table 344 indicates that the logarithmic counter $X_{1,1,0}^{idx}$ 342 counts output cardinalities of zero and one 345.

The table 344 indicates that a logarithmic counter $X_{1,1,1}^{idx}$ 346 counts output cardinalities of two and three 348, a logarithmic counter $X_{1,1,2}^{idx}$ 350 counts output cardinalities 352 of 4, 5, 6, and 7, a logarithmic counter $X_{1,1,3}^{idx}$ 354 counts output cardinalities 356 of 8, 9, 10, 11, 12, 13, 14, and 15, and a logarithmic counter $X_{1,1,4}^{idx}$ 358 counts output cardinalities 360 of 16, 17, 18, 19, 20, 21, 22, 23, 24, 25, 26, 27, 28, 29, 30 and 31. That is, the table 344 illustrates that higher-indexed logarithmic counters in the array of logarithmic counters generally store counts for a larger number of output cardinalities as compared to lower-indexed logarithmic counters. For example, using logarithmic counters essentially creates "logarithmic buckets" of increasing size for tracking larger numbers of output cardinalities for larger-sized buckets. Accordingly, the logarithmic counting approach can be used not just to reduce a number of counters but also to more accurately count lower cardinality values than higher cardinality values.

In general, an index is most useful when selections on an attribute more frequently result in lower output cardinalities than higher output cardinalities. Accordingly, the index advisor can be most interested in logarithmic counter values for logarithmic counters that track lower output cardinalities. The index advisor can propose an index on an attribute or attribute combination based on lower-indexed logarithmic counters that track lower cardinality values. For example, the index advisor can evaluate a certain number of lower-indexed logarithmic counters that track lower cardinality values, with respect to one or more rules, to determine whether to propose an index for the corresponding attribute or attribute combination. For example, a rule can say that an index is to be proposed for the attribute or attribute combination if a sum of the values of the logarithmic counter $X_{1,1,0}^{idx}$ 342, the logarithmic counter $X_{1,1,1}^{idx}$ 346, the logarithmic counter $X_{1,1,2}^{idx}$ 350, the logarithmic counter $X_{1,1,3}{}^{idx}$ 354, and the logarithmic counter $X_{1,1,4}{}^{idx}$ 358 is more than a threshold number (or threshold percentage of all selections in the workload).

Since higher cardinality values are of less interest to the index advisor, an upper limit on the number of logarithmic counters can be determined based on a dataset size $R_i$ 362 (e.g., 15,000,000 rows) and a parameter φ 364 (e.g., 0.1). A highest output cardinality to track 366 can be determined by multiplying the data set size $R_i$ 362 by the parameter φ 364. A highest logarithmic counter array index 368 of 21 can be determined using a formula 370. That is, the logarithmic counter $X_{1,1,20}{}^{idx}$ 334 can be a last bucket for tracking highest output cardinalities of interest. Higher cardinality values that are higher than the highest output cardinality to track 366 are not counted, since selections that have the highest output cardinalities may not be of interest to the index advisor for index determination.

As an example, a selection 372 results in an output cardinality 374 of 14,673,977, which is greater than the highest output cardinality to track 366. Additionally, as illustrated by an equation 376, $\lfloor \log_2 14673977 \rfloor = 23$, (which is larger than the highest logarithmic counter array index 368 of 20). Accordingly, no logarithmic counter is updated in response to determining the output cardinality 374. That is, a logarithmic counter $X_{1,1,23}{}^{idx}$ (or a logarithmic counter $X_{1,1,22}{}^{idx}$ or $X_{1,1,21}{}^{idx}$) are in fact not created or maintained as part of the workload execution statistics 302, as illustrated by X symbols 378, 380, and 382 (and as similarly illustrated for corresponding non-created counters for the workload execution statistics 308).

As mentioned, the logarithmic counters can be considered "lazy" counters, in that a counter is created for an attribute or attribute combination only when a selection with the attribute or attribute combination occurs. For example, the ORDERS table 306 may include a ORDERKEY column but the workload may not include any filter predicates based on ORDERKEY. Accordingly, no logarithmic counters are created for ORDERKEY in this example. Using lazy counters results in fewer counters than if counters for every attribute combination (or every attribute combination of for example, two attributes) are created in advance of executing the workload. For tables with a large number of attributes, an exponential number of attribute combinations (and thus numbers of potential counters) can occur. Use of lazy counters avoids an exponential number of created counters.

Figures 4A, 4B:
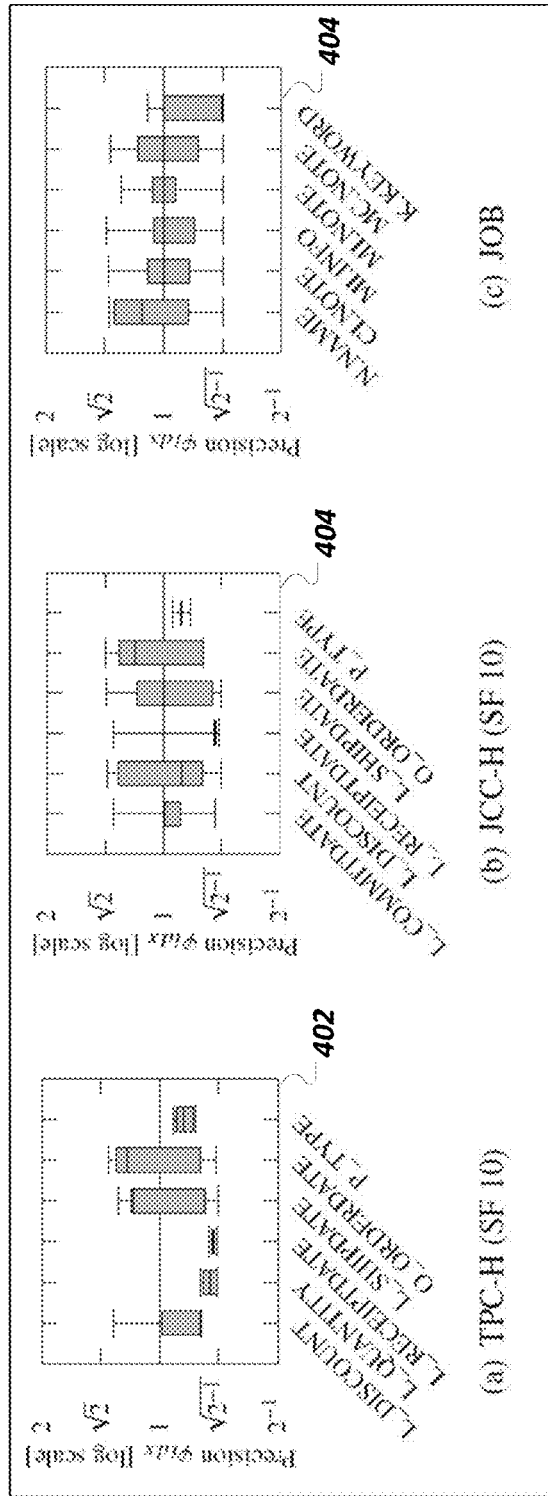
FIG. 4A illustrates evaluation results for an index advisor.
FIG. 4B illustrates evaluation results for an index advisor as compared to results for precise counting one counter per output cardinality.

FIG. 4A illustrates evaluation results 400 for an index advisor. In general, experimental evaluation of the different types of access counters can be illustrated with respect to precision, space efficiency, and runtime overhead using real-world and synthetic benchmarks using an experimental hardware setup. For the evaluation, a workload of 200 queries was randomly generated for each benchmark.

The evaluation results 400 show the results of evaluating access counters for collecting workload execution statistics for an index advisor. Since actual output cardinalities are grouped into intervals $[b^r, b^{r+1})$ and only the number of selections per interval are counted, precision of the access counters can be determined by dividing the estimated output cardinality (i.e., $\sqrt{b^r \cdot b^{r+1}}$) by its actual output cardinality: $\varphi_{idx} = |\widetilde{\sigma_p(R_i)}|/|\sigma_p(R_i)|$. An interval base parameter value b of 2 was selected for the evaluation. Accordingly, actual and estimated output cardinalities differ at most by a factor of $\sqrt{2}$.

The evaluation results 400 includes first, second, and third results 402, 404, and 406 for first, second, and third benchmarks, respectively. Each of the first, second, and third results 402, 404, and 406 show precision $\varphi_{idx}$ results for six attributes $\mathbb{A}_{i,s} \subseteq \mathcal{F}(p), \forall \sigma_p(R_i) \in T(q), \forall q \in W$ of a respective first, second, or third benchmark. The illustrated precision values correspond to a ratio of estimated and actual output cardinalities. Overestimation is shown on top of a precision=1 line, underestimation below the precision=1 line. Each boxplot in the first, second, and third results 404, 404, and 406 illustrates 0.00, 0.25, 0.5, 0.75, and 1.00 percentiles. As shown in the evaluation results 400, for all attributes and all benchmarks, the precision $\varphi_{idx}$ of all selections is at most $\sqrt{2}$ which is in accordance with the selection of the value for the b interval base parameter.

FIG. 4B illustrates evaluation results 450 for an index advisor as compared to results for precise counting one counter per output cardinality. The evaluation results 450 illustrate evaluation results with respect to precision, space efficiency, and runtime overhead of precise counting (e.g., one counter per output cardinality) and the evaluated index advisor access counters (e.g., using lazy counters and interval counting). While precise counting achieves perfect precision, the evaluation results 450 show that required memory overhead values 452, 454, and 456 for precision counting for first, second, and third benchmarks varied between 8.4% and 10.6%, which may be considered substantial (e.g., greater than an acceptable memory overhead value of, for example 0.5%). The approach of lazy counters and interval counting obtained reasonably-accurate and acceptable estimates (e.g., differing at most by from precise counts by a factor of $\sqrt{2}$). Memory overhead values (e.g., values 458, 460, and 461) of the lazy counters and interval counting approach are negligible (e.g., less than the acceptable memory overhead value) due to the lazy counting in combination with intervals. Both approaches yield a low runtime overhead since only the actual output cardinalities of selections are tracked. Acceptable precision and minimal memory and runtime overhead results lead to a conclusion that the index advisor access counters using lazy counting and interval counting are precise, compact, and fast.

Figure 4C:
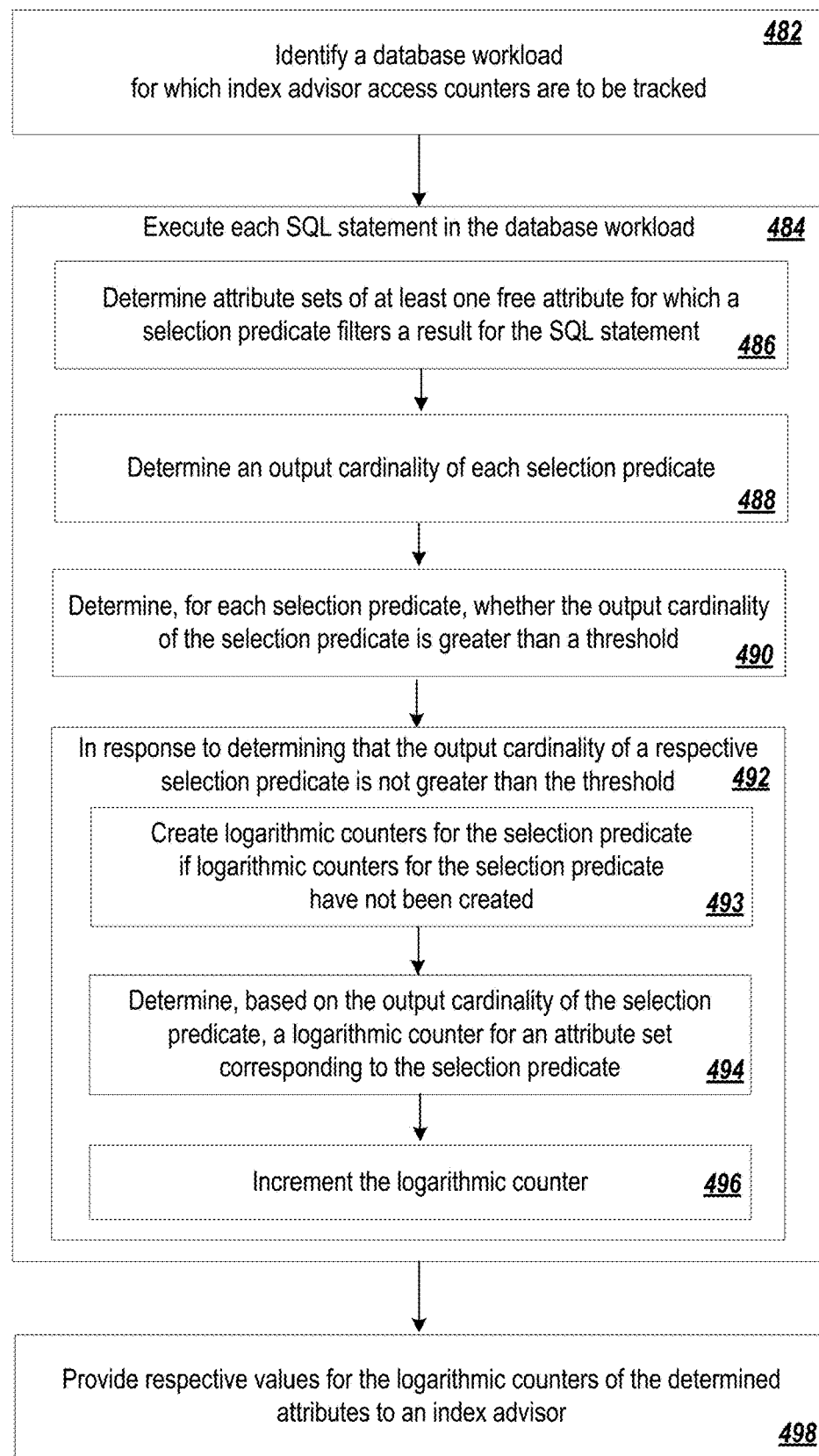
FIG. 4C is a flowchart of an example method for creating and tracking access counters for a data compression advisor.

FIG. 4C is a flowchart of an example method 480 for creating and tracking access counters for an index advisor. It will be understood that method 480 and related methods may be performed, for example, by any suitable system, environment, software, and hardware, or a combination of systems, environments, software, and hardware, as appropriate. For example, one or more of a client, a server, or other computing device can be used to execute method 480 and related methods and obtain any data from the memory of a client, the server, or the other computing device. In some implementations, the method 480 and related methods are executed by one or more components of the system 100 described above with respect to FIG. 1. For example, the method 480 and related methods can be executed by the index advisor 120 of FIG. 1.

At 482, a database workload is identified for which index advisor access counters are to be tracked. The database workload includes at least one SQL statement.

At 484, each SQL statement in the database workload is executed.

At 486, executing a respective SQL statement includes determining attribute sets of at least one free attribute for which a selection predicate (e.g., an index-SARGable predicate) filters a query result for the query with an index-SARGable predicate.

At 488, executing the SQL statement includes determining an output cardinality of each selection predicate.

At 490, executing the SQL statement includes determining, for each selection predicate, whether the output cardinality of the selection predicate is greater than a threshold. The threshold can be based on a maximum query result size.

At 492, a determination is made that the output cardinality of a respective selection predicate is not greater than the threshold.

At 493, logarithmic counters for the selection predicate are created if logarithmic counters have not yet been created for the selection predicate. That is the logarithmic counters can be considered to be lazy counters, in that the lazy counters are created just in time, just before counting is performed for the selection predicate.

At 494, in response to determining that the output cardinality of the selection predicate is not greater than the threshold, a logarithmic counter for an attribute set corresponding to the selection predicate is determined based on the output cardinality of the selection predicate. The logarithmic counter can be selected from among a collection of logarithmic counters for the attribute set. Determining the logarithmic counter can include determining a collection index of a particular logarithmic counter in the collection of logarithmic counters for the attribute set. Determining the collection index can include determining the logarithm of the output cardinality of the selection predicate. Determining the logarithm of the output cardinality of the selection predicate can include determining a current value of a configurable logarithm base parameter and using the current value of the configurable logarithm base parameter when determining the logarithm of the output cardinality of the selection predicate. The logarithmic counters for an attribute set can be created in response to determining that an executed SQL statement includes a selection predicate for the attribute set.

At 496, the logarithmic counter is incremented. If the output cardinality of other selection predicate(s) is greater than the threshold, no logarithmic counter is incremented for those select predicate(s).

At 498, providing respective values for the logarithmic counters of the determined attributes are provided, as the index advisor access counters, to an index advisor. The index advisor can determine attribute sets for which to propose an index based on the logarithmic counters of the respective attribute sets.

FIG. 5A illustrates a use case definition 500 for a data compression advisor. Applying compression to a column may reduce the size of a column, and therefore an amount of data read and processed by sequential scans. However, compression may increase an amount of time used to dereference individual row identifiers (e. g., during projections) since the decompression of individual rows or blocks may incur multiple random memory accesses and/or additional calculations, depending on a compression technique. For instance, some records may compressed differently than others, so a direct access based only on the identifier may not be possible when data is compressed.

A data compression advisor can advise that a column should be compressed only if the speed of SQL statements identified as important SQL statements does not decline under compression as compared to an uncompressed column. Formally stated, the use case definition 500 specifies that the data compression advisor is to recommend compression if execution time for a workload $W_{crit}$ 502 that represents a workload subset including important (e.g., critical) SQL statements is less for a compressed layout $C_{i,j}^c$ 504 than for an uncompressed layout $C_{i,j}^u$ 506.

FIG. 5B illustrates a formal definition 520 of workload execution statistics for a data compression advisor. The formal definition 520 specifies that for each SQL statement, a pair of counters are stored for each attribute, with a first counter representing a count of sequentially-accessed rows and a second counter representing a count of randomly-accessed rows. Existing approaches of collecting workload execution statistics for data compression advisors do not consider the type of access (e.g., sequential vs. random access). An improved data compression advisor can use counts of both the number of rows accessed sequentially and randomly by the workload. In addition to workload execution statistics, characteristics of the data (e.g., number of distinct values, value distribution, or whether the data is sorted) can be used by a data compression advisor when proposing an optimal compression layout.

FIG. 5C illustrates a data structure definition 540 describing workload execution statistics for a data compression advisor. Similar to the formal definition 520, the data structure definition 540 describes that for physical data accesses for a workload W, for each attribute a first integer counter is created and maintained for tracking rows sequentially read and a second integer counter is created and maintained for tracking rows randomly accessed. Maintaining just two counters per attribute fulfills a space-efficiency (e.g., compactness) requirement. A preciseness criteria is also met since actual counts of row accesses are tracked. As shown below with respect to FIG. 7A, a speed criteria is also met.

Figure 6:
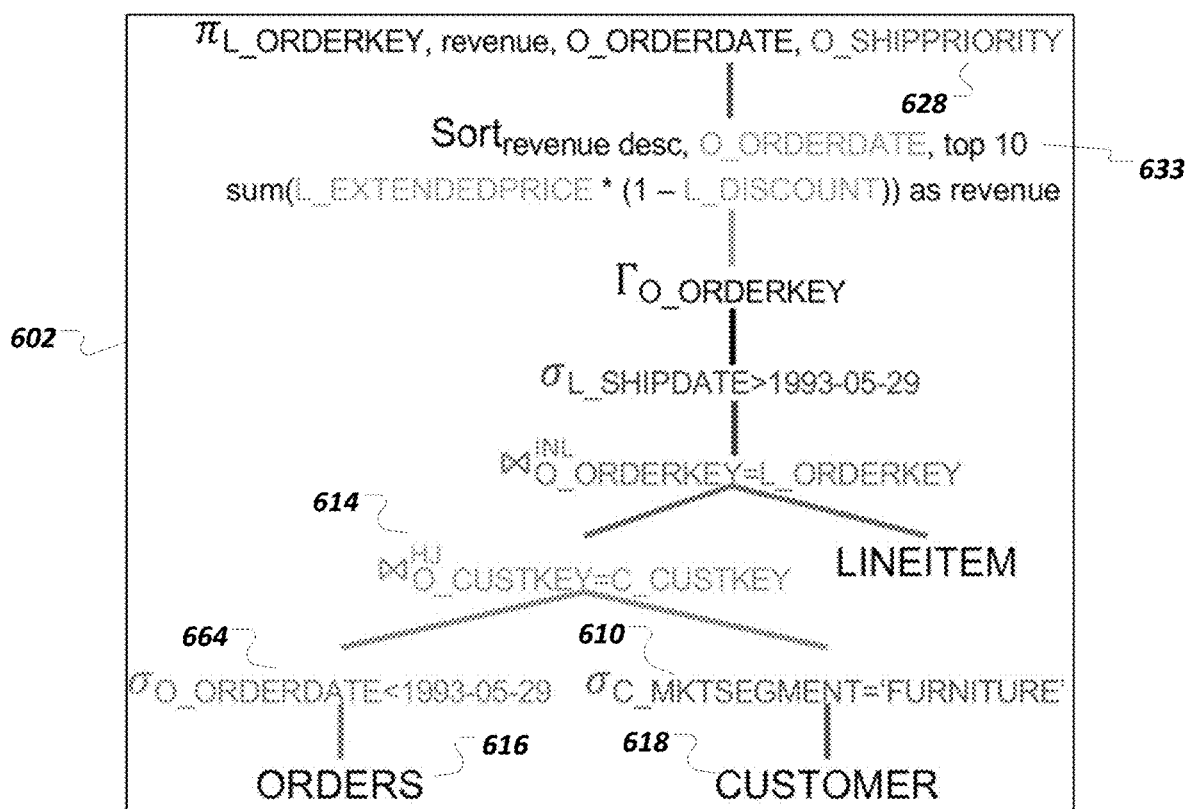
FIG. 6 illustrates example workload execution statistics for a data compression advisor for an example SQL statement.

FIG. 6 illustrates example workload execution statistics 600 for a data compression advisor for an example SQL statement. The example workload execution statistics 600 include a sequential access count 604 $X_{i,j}^s$ and a random-access count 606 $X_{i,j}^r$ for each attribute 608 $A_{i,j}$ included in an example SQL statement that corresponds to an execution plan 602. The data compression advisor can evaluate, for a given attribute, the sequential access count 604 and the random-access count 606, when determining whether to propose data compression for the attribute.

For example, for an attribute for which only (or nearly only) sequential reads are performed, the data compression advisor might propose compression. For instance, in the SQL statement, a selection 610 on a C_MKTSEGMENT attribute 611 results in 1,500,000 sequential reads 612 and zero random reads 613. Accordingly, the data compression advisor can propose compressing the C_MKTSEGMENT attribute 611.

Other attributes may have only (or mostly) random reads. For example, a join 614 between an ORDERS table 616 and a CUSTOMER table 618 causes 299,496 random row accesses 620 (and zero sequential accesses 621) to a C_CUSTKEY attribute 622 and 3,774,696 random accesses 624 (and zero sequential accesses 625) to an O_CUSTKEY attribute 626 (e.g., a customer may have on average approximately ten orders). Since the C_CUSTKEY attribute 622 and the O_CUSTKEY attribute 626 have only random reads, the data compression advisor can exclude those attributes from compression proposals. As another example, a projection 628 on a O_SHIPPRIORITY attribute 630 generates 10 random row accesses 631 (and zero sequential accesses 632) due to a top-10 SQL statement 633. Since only random accesses are performed for the O_SHIPPRIORITY attribute 630, the data compression advisor can determine to not propose compression for the O_SHIPPRIORITY attribute 630. Similarly, significant (e.g., more than a threshold) random read values 634, 636, 638, 640, and 642, combined with zero sequential read values 644, 646, 648, 650, and 652, for an O_ORDERKEY attribute 654, a L_ORDERKEY attribute 656, a L_DISCOUNT attribute 658, a L_EXTENDEDPRICE attribute 660, and a L_SHIPDATE attribute 662, respectively, may result in the data compression advisor determining to not propose compression for those attributes.

For some attributes, a query may result in both sequential and random reads. For example, a selection 664 on an O_ORDERDATE attribute 666 causes 15,000,000 sequential row accesses 668, while other portions of the query result in 377,432 random reads for the O_ORDERDATE attribute 666. Compression of the O_ORDERDATE attribute 666 can result in faster sequential reads when performing the query but random accesses would slow down due to an increased time of dereferencing individual row identifiers due to compression. Accordingly, for situations where both sequential and random reads are performed, the data compression advisor may need to consider a trade-off between a gain of speeding up sequential reads and a time loss of slowing down random accesses. The data compression advisor can use rules, for example, to determine whether to propose compression, based on the values of sequential reads and random reads for an attribute. For example, the data compression advisor can propose compression if the number of random reads is less than a threshold count, or less than a threshold proportion of sequential reads, or if a difference between sequential reads and random reads is greater than a threshold. Other types of rules or formulas can be used.

FIG. 7A illustrates evaluation results 700 for access counters for a data compression advisor. The evaluation results 700 include precision results 702, memory overhead results 704, and runtime overhead results 706 for a first benchmark 708, a second benchmark 710, and a third benchmark 712. The precision results 702 are each 100% precise since, for each attribute, the exact number of rows accessed sequentially and randomly by the workload is counted. Maintaining just two (e.g., 64-bit) integer counters per attribute is also space-efficient. For example, for a benchmark that has 108 attributes in 21 relations, a total memory consumption may only be 1.73 KB (Kilobytes). Compared, for example, to a data set size of a typical database, which may be, for example, 2.28 GB (Gigabytes), the access counters for the query represent only 0.00008% of the data set size. Additionally, the runtime overhead results 706 are each between 4.7% and 9.1%, which can meet a threshold requirement of, for example, 10%. Accordingly, a conclusion can be made that the access counters for the data compression advisor are precise, compact, and fast.

Figure 7B:
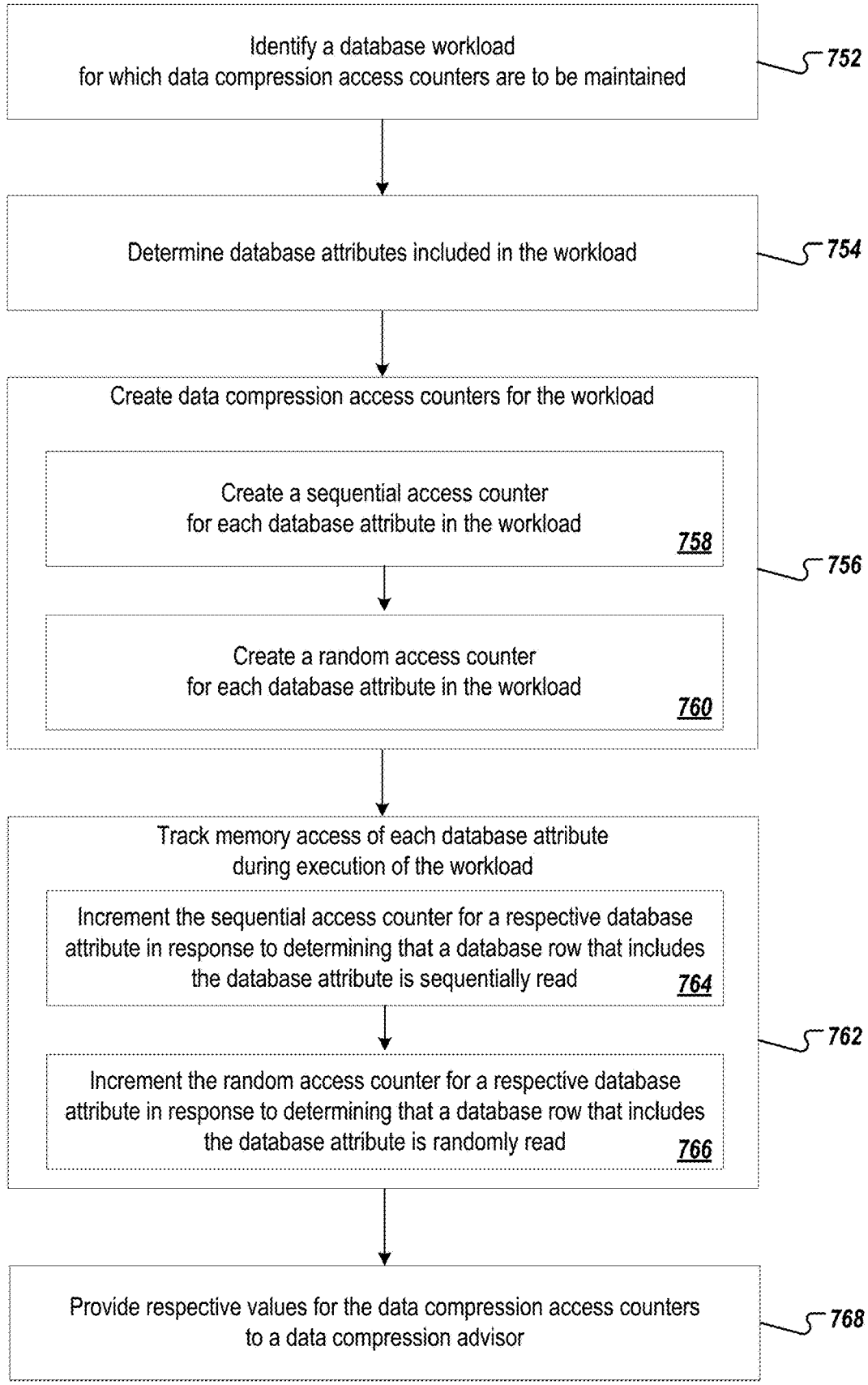
FIG. 7B is a flowchart of an example method for creating and tracking access counters for a data compression advisor.

FIG. 7B is a flowchart of an example method 750 for creating and tracking access counters for a data compression advisor. It will be understood that method 750 and related methods may be performed, for example, by any suitable system, environment, software, and hardware, or a combination of systems, environments, software, and hardware, as appropriate. For example, one or more of a client, a server, or other computing device can be used to execute method 750 and related methods and obtain any data from the memory of a client, the server, or the other computing device. In some implementations, the method 750 and related methods are executed by one or more components of the system 100 described above with respect to FIG. 1. For example, the method 750 and related methods can be executed by the data compression advisor 122 of FIG. 1.

At 752, a database workload is identified for which data compression access counters are to be maintained. A database workload can be a set of one or more queries, for example.

At 754, database attributes included in the workload are determined. Database attributes can be columns of a database table, for example.

At 756, data compression access counters are created for the workload. Data compression access counters can include sequential access counters and random access counters.

At 758, a sequential access counter is created for each database attribute in the workload.

At 760, a random access counter is created for each database attribute in the workload.

At 762, memory access of each database attribute of the workload is tracked during execution of the workload.

At 764, the sequential access counter for a respective database attribute is incremented in response to determining that a database row that includes the database attribute is sequentially read.

At 766, the random access counter for a respective database attribute is incremented in response to determining that a database row that includes the database attribute is randomly read.

At 768, respective values for the data compression access counters are provided to a data compression advisor. The data compression advisor can determine, for each database attribute of the database workload, whether to propose data compression for the database attribute, based on the respective values for the data compression access counters for the database attribute. Determining whether to propose data compression for a first database attribute can include: determining an estimated execution time for the database workload if the first database attribute is compressed; determining an estimated execution time for the database workload if the first database attribute is not compressed; and determining to propose data compression for the first database attribute in response to determining that the estimated execution time for the database workload if the first database attribute is compressed is less than the estimated execution time for the database workload if the first database attribute is not compressed.

Determining whether to propose data compression for a first database attribute can include: comparing the value of the sequential access counter for the first database attribute to the value of the random access counter for the first database attribute; and determining whether to propose data compression for the first database attribute based on comparing the value of the sequential access counter for the first database attribute to the value of the random access counter for the first database attribute. Determining whether to propose data compression for the first database attribute based on comparing the value of the sequential access counter for the first database attribute to the value of the random access counter for the first database attribute can include determining whether the value of the sequential access counter for the first database attribute is substantially larger than the value of the random access counter for the first database attribute. For example, a rule can be identified that defines when a value of a sequential access counter for a database attribute is substantially larger than a value of a corresponding random access counter for the database attribute and the rule can be evaluated with respect to the first database attribute to determine whether the value of the sequential access counter for the first database attribute is substantially larger than the value of the random access counter for the first database attribute. As an example, a rule can specify that a value of a sequential access counter for a database attribute is substantially larger than a value of a corresponding random access counter for the database attribute when a ratio of the value of the sequential access counter for the database attribute to the value of the corresponding random access counter for the database attribute is more than a predetermined threshold. For example, if the ratio of sequential accesses to random accesses for a database attribute is at least ten, the database compression advisor can determine to propose compression for the database attribute.

FIG. 8A illustrates a use case definition 800 for a buffer pool size advisor. A buffer pool can be used to retain frequently-accessed (e.g., "hot") data of a working set in DRAM (Dynamic Random-Access Memory). A buffer pool size advisor can recommend a minimal buffer pool size such that a performance constraint (e.g., a maximum workload execution time) is still fulfilled. To do this, a buffer pool size advisor can identify the workload's working set and configure the buffer pool size so that all hot pages can still be held in DRAM. As described in the use case definition 800, a buffer pool size advisor can propose a minimal buffer pool size B 802 such that an estimated execution time 804 of a workload W 806 based on workload execution statistics FStat 808 does not violate a given SLA (Service Level Agreement) threshold 810.

In general, memory resources for a buffer pool may be limited, since memory resources are generally more expensive than disk storage. A buffer pool size advisor may therefore be limited in how large of a buffer pool size may be proposed. If the buffer pool advisor proposes too small of a buffer pool, an unacceptable number of page evictions may occur that may deteriorate database performance. The buffer pool size recommended by the buffer pool size advisor can be expressed in a page count representing a number of pages to store in the buffer pool. The buffer pool size advisor can recommend the page count based on page access workload execution statistics.

FIG. 8B illustrates a formal definition 820 of workload execution statistics for a buffer pool size advisor. The formal definition 820 specifies that for each SQL statement of a workload, workload execution statistics F3 for the buffer pool size advisor include page access frequency statistics for each page that stores at least one attribute of the workload. As mentioned, calculating for each page the number of accesses can be important for a buffer pool size advisor. For example, based on a number of page accesses, if a page is accessed more often, the buffer pool size advisor may recommend that the page should be in the buffer pool, or in general, that pages that are accessed at least a certain number of times should be in the buffer pool. Accordingly, the buffer pool size advisor can recommend an overall buffer pool size based on the page access counts of respective pages.

FIG. 8C illustrates a data structure definition 840 describing workload execution statistics for a buffer pool size advisor. One approach for page access counters is to maintain an access counter for each page. However, keeping track of accesses that span multiple pages requires updating each counter for each accessed page. Instead of updating for each query the frequencies of all touched pages individually, the data structure definition 840 formally describes updating only a respective start page counter 842 and a respective end page counter 844, with respect to starting and ending pages of pages accessed in a range 846 of pages.

As an example, if a query accesses the pages $[P_{i,j,v}, P_{i,j,w}]$, $P_{i,j,v}, P_{i,j,w} \in \mathbb{P}_{i,j}$ (e.g., where $\mathbb{P}_{i,j}$ represents all pages storing at least one attribute for the query), a corresponding counter to the starting page $P_{i,j,v}$ is incremented, while a counter of the page $P_{i,j,w+1}$ is decremented (e.g., since $P_{i,j,w}$ is the last accessed page). Updating the starting page counter and the ending page counter enables counter updates in constant time. Since the counter of the following page after the last accessed page is adjusted, in total $|\mathbb{P}_{i,j}+1|$ counters can be used to be able to decrement a counter for accesses to the last page $P_{i,j,|\mathbb{P}_{i,j}+1|}$.

After workload execution statistics collection, a final page access frequency 848 can be derived for a page by calculating a prefix sum 850 of the counters up to the target page. Memory overhead is low because only a single (e.g., 64-bit) signed integer counter per page is stored. For example, for a database with a data set size of 2.28 GB, a memory footprint can vary between 0.2% (64 bit 4 KB page size) and 0.00005% (64 bit 16 MB page size), depending on the page size.

Figure 9:
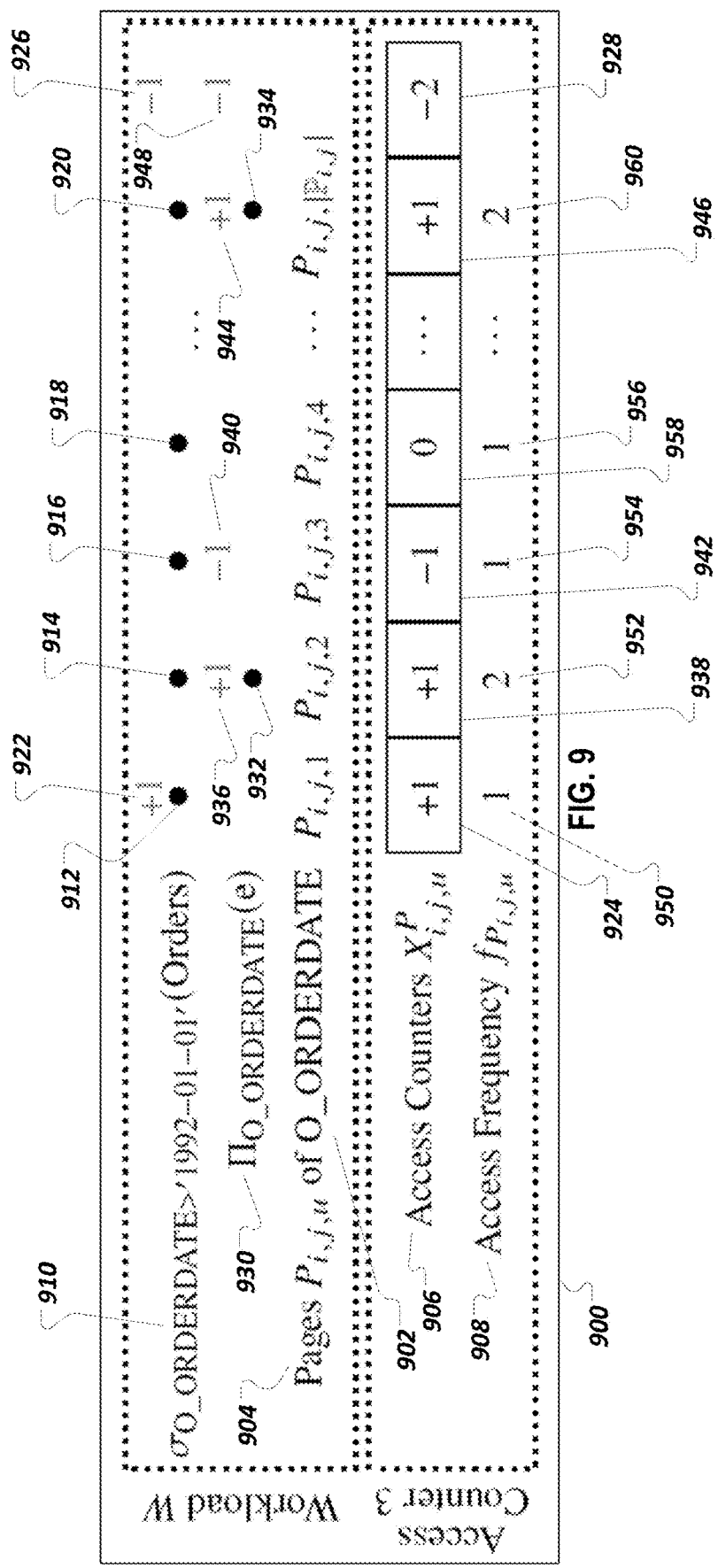
FIG. 9 illustrates example workload execution statistics for a buffer pool size advisor for example workloads.

FIG. 9 illustrates example workload execution statistics 900 for a buffer pool size advisor for example workloads. Data for an O_ORDERDATE column 902 can be stored in different pages 904 $P_{i,j,v}$. As an example, the O_ORDERDATE column 902 may have 15 million rows, and page sizes for a database may range from between 4 KB and 16 MB, so a given page may include, for example, 100, 1000, or some other number of O_ORDERDATE values, depending on the size of the O_ORDERDATE values and the page size(s) used for the database. If certain pages of the pages 904 are accessed more frequently than other pages, the more frequently accessed pages can be stored in the buffer pool. As described in more detail below, access counters 906 can track page accesses of the pages 904, and page access frequencies 908 can be derived from the access counters 906. A proposed or recommended buffer pool size can be determined based on the page access frequencies 908, such as based on how many of the page access frequencies 908 are more than a threshold.

A selection workload 910 can result in sequential access of many pages (e.g., all the pages 904), as represented by page access indicators 912, 914, 916, 918, and 920. An approach of incrementing an access counter for each accessed page can be expensive, since for some workloads an entire column, or at least substantial portions of the column, may be scanned to determine values which match a predicate, for example. Rather than increment an access counter for each accessed page, a "first/last" approach can be used in which an access counter for a first accessed page is incremented and an access counter associated with a next page after a last accessed page is decremented. For a last page for which data is stored for the column, an extra counter can be utilized.

As an example, the access counters 906 can be updated based on the execution of the workload 910 accessing pages $P_{i,j,1}, P_{i,j,2}, P_{i,j,3}, P_{iji,4}, \ldots, P_{i,j,|\mathbb{P}_{i,j}+1|}$ (e.g., corresponding to the page access indicators 912, 914, 916, 918, and 920), as follows. An increment operation 922 can be performed to increment an access counter 924 for a first-accessed page. No access counters are modified for the intervening page accesses corresponding to the page access indicators 914, 916, and 918 (and other accesses occurring before a last page access). A decrement operation 926 is performed to decrement an access counter 928 which is a "next" access counter for a last-accessed page $P_{i,j,|\mathbb{P}_{i,j}|}$. Formally stated, if a query accesses the pages in the range $[P_{i,j,v}, P_{i,j,w}]$, $P_{i,j,v}, P_{i,j,w} \in \mathbb{P}_{i,j}$, the corresponding counter to page $P_{i,j,v}$ is incremented, while the counter of page $P_{i,j,w+1}$ is decremented since $P_{i,j,w}$ is the last accessed page. This first/last approach enables counter updates in constant time, as compared to non-constant counter updates that occurs when updating a counter for every accessed page.

As another example, a projection workload 930 can result in random accesses of specific O_ORDERDATE values, rather than a sequential access scan. For example, the projection workload 930 can result in a first page access and a second page access that are illustrated by a first page access indicator 932 and a second page access indicator 934. Since the first page access is a random access of one page and not an access of a range of multiple pages resulting from a sequential scan of records, the first accessed page can be considered both a first and last page with respect to adjusting access counters. Accordingly, an increment operation 936 can be performed to increment an access counter 938 associated with the first accessed page and a decrement operation 940 can be performed to decrement an access counter 942 that is a next access counter with respect to the first accessed page. Similarly, in response to the second page access, an increment operation 944 can be performed to increment an access counter 946 associated with the second accessed page and a decrement operation 948 can be performed to decrement the access counter 928 (which is a next access counter with respect to the second accessed page).

After workload execution statistics collection, the page access frequencies 908 can be derived by calculating a prefix sum of the access counters 906 up to a target page. For example, a page access frequency 950, as a first page access frequency, is equal to the access counter 924 (e.g., a value of one, corresponding to the page access indicator 922). A second page access frequency 952 has a value of 2 (e.g., equal to a sum of the access counter 924 and the access counter 938, and corresponding to the page access indicators 914 and 932). A third page access frequency 954 has a value of one (e.g., corresponding to a sum of the access counter 924, the access counter 938, and the access counter 942, and to the page access indicator 916). A fourth page access frequency 956 has a value of one (e.g., corresponding to a sum of the access counter 924, the access counter 938, the access counter 942, and an access counter 958, and to the page access indicator 918). A last page access frequency 960 has a value of two (e.g., corresponding, in the illustrated example, to a sum of the access counter 924, the access counter 938, the access counter 942, the access counter 958, and the access counter 946, and to the page access indicators 920 and 934).

FIG. 10A illustrates evaluation results 1000 for workload execution statistics for a buffer pool size advisor. The evaluation results 1000 include precision results 1002, space efficiency results 1004, and runtime overhead results 1006 for both naïve block-level counting 1008 (e.g., updating the frequencies of all touched pages) and a first/last page counting approach 1010 (e.g., updating only the frequencies associated with first and last accessed pages). Both approaches are 100% precise since, for each memory page, all physical accesses are tracked. Compared to a data set size of, for example, 2.2 GB, memory overhead for both approaches is at most 0.2% compared to the data set size, assuming a smallest page size of 4 KB (e.g., 64 bit counter/4 KB page size). One signed 64-bit integer counter per page was used for the evaluation (e.g., signed being used rather than unsigned since counters may become negative). The runtime overhead of naïve block-level counting varies between 8.3% and 21.8%. The first/last page counting approach incurs less runtime overhead (e.g., between 5.2% and 13.5%) since updates to counters are performed in constant time (e.g., updates to only two counters) for queries that span multiple pages and the naïve block-level counting includes updating a counter for every accessed page. One hundred percent precision, 0.2% memory overhead, and improved runtime overhead lead to a conclusion that the first/last page counting approach is precise, compact, and fast.

Figure 10B:
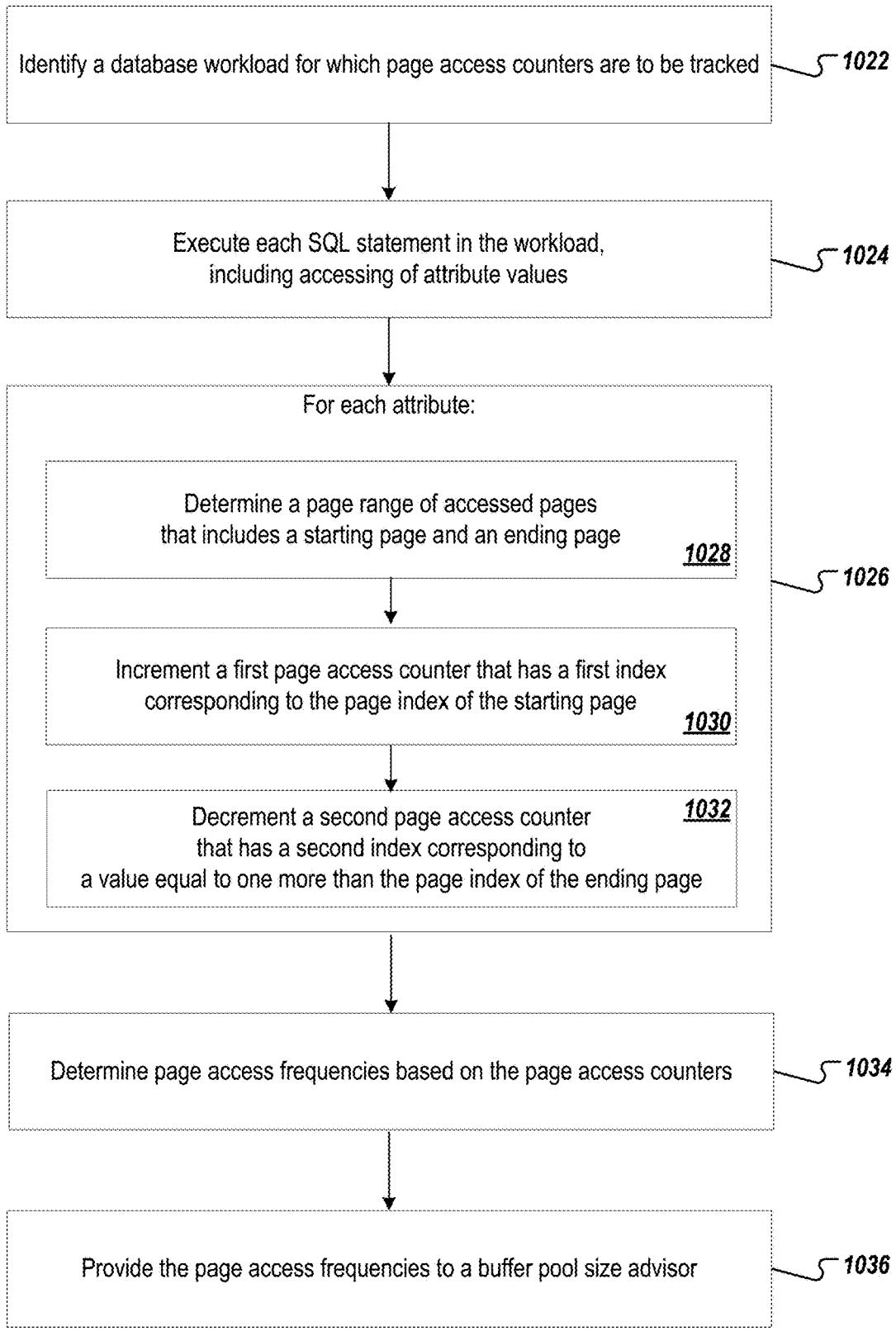
FIG. 10B is a flowchart of an example method for creating and tracking access counters for a buffer pool size advisor.

FIG. 10B is a flowchart of an example method 1020 for creating and tracking access counters for a buffer pool size advisor. It will be understood that method 1020 and related methods may be performed, for example, by any suitable system, environment, software, and hardware, or a combination of systems, environments, software, and hardware, as appropriate. For example, one or more of a client, a server, or other computing device can be used to execute method 1020 and related methods and obtain any data from the memory of a client, the server, or the other computing device. In some implementations, the method 1020 and related methods are executed by one or more components of the system 100 described above with respect to FIG. 1. For example, the method 1020 and related methods can be executed by the buffer pool size advisor 124 of FIG. 1.

At 1022, a database workload is identified for which page access counters are to be tracked. The database workload includes at least one query.

At 1024, each SQL statement in the database workload is executed. Executing a respective SQL statement includes accessing attribute values for at least one attribute when executing the SQL statement. The workload can include a first SQL statement that includes a filter predicate on a first attribute. Executing the first SQL statement can include performing a sequential scan of all pages that include attribute values for the first attribute to determine which attribute values match the filter predicate. The workload can include a second SQL statement for which, during execution, a first page is randomly accessed to retrieve a first attribute value for a first attribute.

At 1026, page access counters are tracked for each respective attribute for which attribute values are accessed.

At 1028, for each attribute value access during a query execution, a page range of at least one page that is accessed when accessing attribute values for the attribute is determined. The page range is defined by a starting page and an ending page and each page in the page range has a page index corresponding to the respective page. When performing a sequential scan, the starting and ending pages of the page range can correspond to first and last pages accessed during the sequential scan, respectively. For a query that results in a random access, the page range can include just the page that was randomly accessed during execution of the query.

At 1030, a first page access counter in a collection of page access counters is incremented. The first page access counter has a first index corresponding to the page index of the starting page.

At 1032, a second page access counter in the collection of page access counters is decremented. The second page access counter has a second index corresponding to a value equal to one more than the page index of the ending page.

At 1034, page access frequencies are determined based on the page access counters. The page access frequency for a page can be determined by calculating a sum of the page access counter of the page and page access counters of pages that precede the page access counter of the first page in the collection of page access counters.

At 1036, the page access frequencies are provided to a buffer pool size advisor. The buffer pool size advisor can use the page access frequencies to determine a buffer pool size for the workload.

FIG. 11A illustrates a use case definition 1100 for a table partitioning advisor. The table partitioning advisor can recommend table range partitioning that separates, for example, hot and cold data into disjoint range partitions, which can result in an improved buffer pool hit ratio. Although hot and cold data is mentioned, data can, in general, be partitioned based on similar access patterns. As described in the use case definition 1100, the table partitioning advisor can propose a buffer pool size B 1102 and a range-partitioning $S_i$ 1104 for each relation such that the buffer pool size B 1102 is minimized while an estimated execution time 1106 of a workload W 1108 with workload execution statistics FStat 1110 does not exceed a maximum workload execution time 1112.

FIG. 11B illustrates a formal definition 1120 of workload execution statistics for a table partitioning advisor. The formal definition 1120 specifies that FStat F4 stores for each value $v_{i,j,k}$ of the active attribute domain of an attribute $A_{i,j}$ the access frequency $f_{v_{i,j,k}}$. For each executed SQL statement $q \in W$, the accessed values for each accessed attribute $A_{i,j}$ are determined. If a SQL statement q sequentially accesses the attribute $A_{i,j}$, the access frequency $f_{v_{i,j,k}}$ of value $v_{i,j,k}$ is incremented by the number of matching rows that consist of value $v_{i,j,k}$ for attribute $A_{i,j}$. A matching row, for instance, can be a selection $\sigma_p(e) \in T(q)$ where p references $A_{i,j}$ and $v_{i,j,k}$ satisfy p. In contrast, if a SQL statement q randomly accesses the attribute $A_{i,j}$, the access frequency $f_{v_{i,j,k}}$ of value $v_{i,j,k}$ is incremented by the number of rows that consist of value $v_{i,j,k}$ for attribute $A_{i,j}$ and are accessed by q.

FIG. 11C illustrates a data structure definition 1140 describing workload execution statistics for a table partitioning advisor. The workload execution statistics for the table partitioning advisor can include block counters 1142 and a stream-summary data structure 1144. As described by a physical access tracking description 1146 (and in more detail below with respect to FIG. 12), physical accesses during execution of a workload W can be tracked using both the block counters 1142 and the stream-summary data structure 1144. FIG. 13 describes in more detail how table partitioning access counters can be computed by combining the block counters 1142 and the stream-summary data structure 1144.

Figure 12:
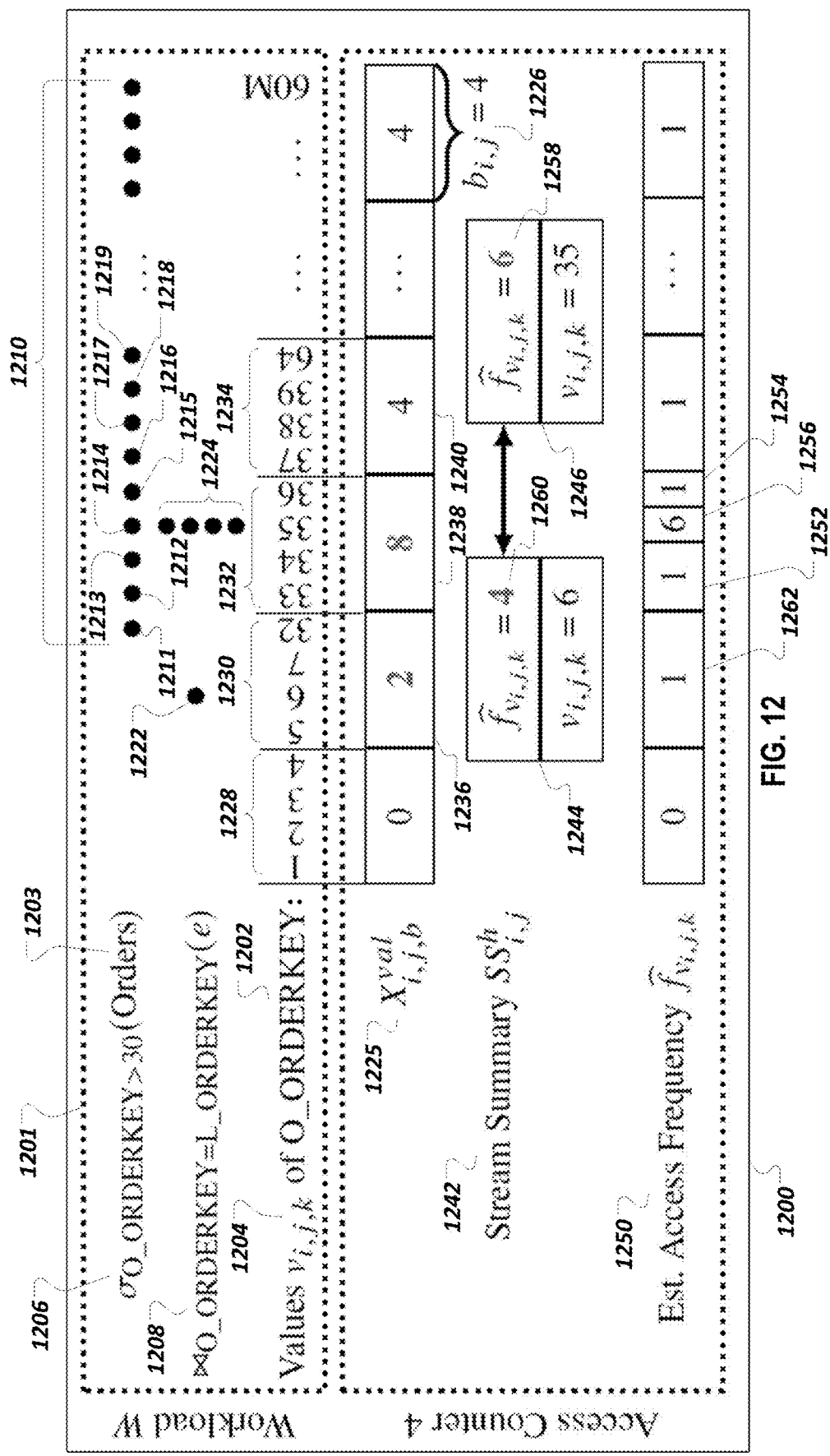
FIG. 12 is an illustration that illustrates example workload execution statistics for a table partitioning advisor for an example workload.

FIG. 12 is an illustration 1200 that illustrates example workload execution statistics for a table partitioning advisor for an example workload. The illustration 1200 illustrates a workload W 1201 for an O_ORDERKEY attribute 1202 of an ORDERS table 1203. Workload execution statistics for a table partitioning advisor can estimate access counts for specific values of the O_ORDERKEY attribute 1202. Values 1204 of the O_ORDERKEY attribute 1202 are illustrated (e.g., the lowest values of the O_ORDERKEY attribute 1202 include values of 1, 2, 3, 4, 5, 6, 7, 32, 33, 34, 35, 36, 37, 38, 39, and 64).

The workload 1201 includes a selection 1206 and a join 1208. The selection 1206 filters the ORDERS table 1203 by selecting records that have an O_ORDERKEY attribute value greater than thirty. Accordingly, during execution of the selection 1206, sequential accesses 1210 occur as part of a sequential scan. For example, the sequential accesses 1210 include sequential accesses 1211, 1212, 1213, 1214, 1215, 1216, 1217, 1218, and 1219 (among other accesses for higher O_ORDERKEY values). As another example, execution of the join 1208 can result in random accesses of O_ORDERKEY attribute 1202 values. For example, a random access 1222 (e.g., of a value 6) and multiple random accesses 1224 (e.g., of a value 35) have occurred as a result of executing the join 1208.

A naïve approach for tracking O_ORDERKEY value accesses can be to use a separate row-level counter for each O_ORDERKEY attribute value. However, the O_ORDERKEY attribute (and other attributes) can include a domain of values that includes a significant enough number of values that using a row-level counter approach becomes prohibitively resource expensive.

As an alternative to row-level counters, value range counters 1225 (e.g., "bucketized" counters) can be used. The value range counters 1225 can be based on a bucket size $b_{i,j}$ for an attribute $A_{i,j}$. For instance, a bucket size of four 1226 is used in the example of FIG. 12. Buckets 1228, 1230, 1232, and 1234 can be used to track accesses to the lowest O_ORDERKEY attribute 1202 values. For example, the buckets 1228, 1230, 1232, and 1234 can be used to track the following ranges of values, respectively: (1, 2, 3, 4), (5, 6, 7, 32), (33, 34, 35, 36), and (37, 38, 39, 64).

When using a value range approach, during execution of the workload 1201, a respective value range counter 1225 is incremented when an access of an O_ORDERKEY attribute 1202 corresponding to the bucket occurs. For example, a value range counter 1236 corresponding to the bucket 1230 has been incremented twice, in response to the random access 1222 and the sequential access 1211, respectively. As another example, a value range counter 1238 corresponding to the bucket 1232 has been incremented eight times, in response to the sequential accesses 1212, 1213, 1214, and 1215 and to the random accesses 1224. As yet another example, a value range counter 1240 corresponding to the bucket 1234 has been incremented four times, in response to the sequential accesses 1216, 1217, 1218, and 1219.

While the value range counters 1225 reduce memory overhead as compared to row-level counters, the value range counters 1225 can result in lost precision, especially for attribute values which are accessed frequently. For instance, with respect to the bucket 1232, the value range counter 1238 reflects a total access count of 8 for values in the bucket 1232 (as mentioned). However, the value 35 has been accessed substantially more often than the other values in the bucket 1232 (e.g., the value 35 has been accessed 5 times whereas the other values in the bucket 1232 have each only been accessed once). The value 35 can be considered a "heavy hitter," as in an attribute value that is heavily (e.g., more frequently) accessed as compared to other values. Heavy-hitter values can be important to the table partitioning advisor when determining table partitioning criteria.

However, once the access counts have been collected in the value range counters 1225, correctly identifying heavy-hitter values (and their magnitudes) can be imprecise when based on the value range counters 1225. For example, the value range counter 1238 can be used to estimate access counts for each value in the bucket 1232, such as by dividing a value (e.g., 8) of the value range counter 1238 by the bucket size (e.g., 4), to get an estimated access count of 2 for values in the bucket 1232. However, the estimated access count of 2 is an underestimate for the value 35 and an overestimate for the values 33, 34, and 36. Accordingly, the heavy-hitter value of 35 might not be properly identified. Thus, with the value range approach access frequencies of heavy hitters tend to be underestimated, whereas frequencies of rarely accessed values (e.g., a "long tail") tend to be overestimated.

To improve identification of heavy-hitter values while still maintaining a memory-saving benefit of the value range counters 1225, a stream-summary data structure 1242 can be used in combination with the value range counters 1225. The stream-summary data structure 1242 has a configurable number of slots. The stream-summary data structure 1242 in the example of FIG. 12 has two slots (e.g., a first slot 1244 and a second slot 1246) for illustration but a higher number of slots can be used. The stream-summary data structure 1242 can be used to estimate counts of the most frequently accessed attribute values (e.g., heavy hitters). The stream-summary data structure 1242 includes, for each slot in the stream-summary data structure 1242, an attribute value being counted and a corresponding count for the attribute value (i.e., access frequency). For example the first slot 1244 is currently being used to estimate accesses for the attribute value 6 (e.g., with a current count of 4) and the second slot 1246 is currently being used to estimate accesses for the attribute value 35 (e.g., with a current count of 6).

When an attribute value access occurs, a determination can be made as to whether a slot exists for the value in the stream-summary data structure 1242. If the slot exists, a counter for the attribute value in the stream-summary data structure 1242 is incremented. If the slot does not exist, a determination can be made as to whether the stream-summary data structure 1242 includes an empty (e.g., available) slot (e.g., when the stream-summary data structure 1242 is first being filled). If there is an available slot, the slot is assigned to the attribute value and an initial count of one is generated for the attribute value. If there is not an available slot, a slot that has a lowest current count is identified and the slot is freed and made available to the attribute value (by keeping the current counter). For example, the first slot 1244 may be reassigned to an attribute value other than 6 when a new attribute value access is detected, based on the first slot 1244 having a lowest current count estimate. By reassigning slots that have a lowest count, highest-frequency values are maintained in the stream-summary data structure 1242 and lowest-frequency values are more likely to be removed as new attribute values are accessed.

The stream-summary data structure 1242 can be used to monitor the top h most frequently accessed values of a value range (e.g., where h is the number of slots). However, depending on a value of h, not all values stored in the stream-summary data structure 1242 may be considered heavy hitters. To identify actual heavy hitters in the stream-summary data structure 1242, the count values in the stream-summary data structure 1242 can be considered along with corresponding values in the value range counters 1225. Since the stream-summary data structure 1242 generally overestimates access frequencies of rarely accessed values, an assumption can be made that an estimated frequency of a heavy hitter in the stream-summary data structure 1242 would not be significantly larger than a corresponding value range counter 1225. The stream-summary data structure 1242 may also tend to overestimate heavy hitters. Therefore, a tolerance parameter $\lambda \in \mathbb{R}_{>0}$ can be used such that the estimated access frequency of an attribute value in the stream-summary data structure 1242 is only considered as an estimate of a heavy hitter if the frequency estimate in the stream summary data structure is at most $\lambda$-times larger than the corresponding value range counter 1225.

To calculate access frequencies 1250 of attribute values, a first check is performed to see if a corresponding value range bucket includes a heavy hitter (e.g., if the bucket includes a heavy hitter that is at most $\lambda$-times larger than the corresponding value range counter 1225). If the corresponding value range includes a heavy hitter, to determine an access frequency for values in the long tail, the frequency count in the stream-summary data structure 1242 for the heavy hitter can be subtracted from the value range counter for the value range. The estimated access frequency of values from the long tail can be determined by dividing the remaining value range count by the number of values from the long tail in the value range. The estimated access frequency for the heavy hitters can be obtained from the stream-summary data structure 1242.

As an example, the value 35 stored in the stream-summary data structure 1242 is considered a heavy hitter as the count 6 is not larger than $\lambda \cdot X_{i,j,2}^{val}$ with the tolerance parameter $\lambda=1.2$. Therefore, the value range counter $X_{i,j,2}^{val}$ is decremented by 6 (e.g., which generates an intermediate result of 2). To calculate estimated access frequencies for the values from the long tail, (e.g., values 33, 34, and 36) the intermediate result of 2 can be divided by a count of the number of the long tail values in the bucket 1232 (e.g., a count of 3), for a value of one (e.g., after rounding up to a next highest integer), as illustrated by access frequencies 1252 and 1254 (e.g., the access frequency 1252 depicts two access frequency values for values 33 and 34, respectively). An access frequency 1256 of 6 for the attribute value 35 can be obtained from a frequency value 1258 stored for the value 35 in the second slot 1246 of the stream summary data structure 1242. The access frequency 1256 of 6 overestimates an actual access frequency of 5, but the estimate is within a tolerated range.

As another example, the value 6 is not classified as a heavy hitter when a tolerance parameter $\lambda=1.2$ is used, since an estimated access frequency of 4 1260 for the value 6 in first slot 1244 of the stream-summary data structure 1242 is more than $\lambda$-times larger than the value of 2 for the value range counter $X_{i,j,1}^{v,l}$. Accordingly, an estimated access frequency 1262 of one can be determined for each of the values in the bucket 1230 (including the value 6), by dividing the value range counter 1236 (e.g., a value of 2) by the bucket size (e.g., a value of 4), and rounding up to a next highest integer.

FIG. 13 illustrates formal definitions 1300 to calculate the access frequency 1302 for a table partitioning advisor. The calculation of the access frequency 1302 is based on value range counters 1304 and data in a stream-summary data structure 1306, as described above. As mentioned, a bucket size $b_{i,j}$ for attribute $A_{i,j}$ 1308 and a tolerance parameter $\lambda$ can be configured, for example, to configure memory and precision trade-offs.

As mentioned, the access frequency counters 1302 can be provided to a table partitioning advisor, for determining table partitioning criteria for partitioning database tables. Table partitioning criteria can be used to separate data into different partitions based on similar access frequencies. For instance with respect to the example of FIG. 12, after evaluating access frequencies for the workload 1201 (and possibly other workloads), the table partitioning advisor could determine to create a table partitioning criteria of "O_ORDERKEY>30", which can result in ORDERS records that have an O_ORDERKEY value greater than 30 being stored in a first partition and ORDERS records that have an O_ORDERKEY value equal to or less than 30 being stored in a second partition. A runtime selection such as the selection 1206 would therefore only need to access the first partition.

Figure 14:
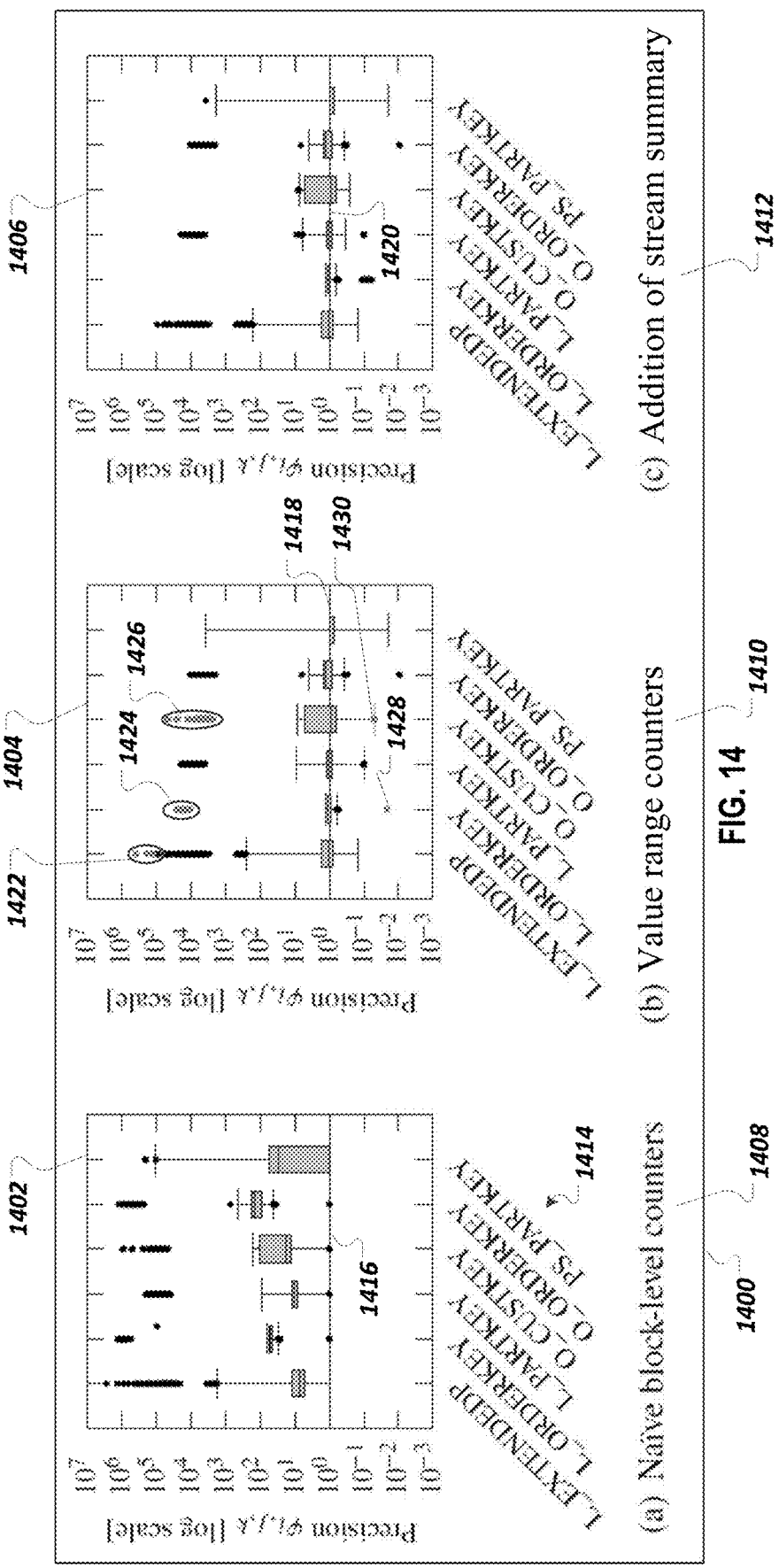

FIG. 14 illustrates evaluation results 1400 for workload execution statistics for a table partitioning advisor. The evaluation results 1400 include graphs 1402, 1404, and 1406 that respectively show results using a) a naïve block level counting approach 1408, b) a value range counting approach 1410 (without using a stream-summary data structure), and c) a combined stream summary approach 1412 using both value range counters and a stream-summary data structure, for six example attributes 1414.

The naïve block level counting approach 1408 can include grouping values into value ranges and incrementing a value range counter by one whenever a value or sub-range of the value range is read. However, with a value range counter representing the access frequency of each value in the range, frequencies can be substantially overestimated. With the value range counting approach 1410, the access frequency of a value can be more precisely estimated by dividing the value range counter by the block size. However, estimated access frequencies can be prone to produce skewed access patterns. For example, access frequencies of heavy hitters can be underestimated, whereas frequencies of rarely accessed values (e.g., the long tail) can be overestimated. As described above, the combined stream summary approach 1412 can correct for imprecision for heavy hitters and the long tail.

In the evaluation of the table partitioning advisor workload execution statistics, to fulfill a space efficiency requirement, a memory footprint of the access counters was limited to 1% of a column size (e.g., an encoded column and associated dictionary). For some attributes, including the attributes 1414, a block size greater than one was used, to fulfill the space efficiency requirement. For the combined stream summary approach 1412, a stream-summary data structure was used to track a top-100 most frequently accessed values (e.g., a stream-summary data structure with 100 slots). A tolerance parameter λ was used, (e.g., a value is classified as a heavy hitter if its access frequency estimated by the stream-summary is at most 1.2× larger than its value range counter). To calculate the precision of a value $\varphi_{i,j,k}$, the estimated access frequency was divided by the actual access frequency (e.g., $\varphi_{i,j,k} = \hat{f}_{v_{i,j,k}} / f_{v_{i,j,k}}$). Each of the graphs 1402, 1404, and 1404 illustrate the precision $\varphi_{i,j,k}$ using a respective approach, for the six attributes 1414 that had a block size greater than one.

In the graphs 1402, 1404, and 1406, overestimation is shown above a respective precision=1 line (e.g., lines 1416, 1418, and 1420) and underestimation is shown below the precision=1 line. Each graph 1402, 1404, and 1406 displays 0.0001, 0.25, 0.5, 0.75, and 0.9999 precision percentiles.

The graph 1402 illustrates that the naïve block level counting approach 1408 substantially overestimates access frequencies (e.g., plotted data is above the precision=1 line 1416). The graph 1404 illustrates that the value range counting approach 1410 substantially improves precision (as compared to the naïve block level counting approach 1408) by several orders of magnitude (e.g., most of the estimates are within a bound of factor 2). However, for all six attributes 1414, heavy hitters are underestimated (e.g., as illustrated by plotted data 1422, 1424, and 1426) and rarely-accessed values are overestimated (e.g., as illustrated by plotted data 1428 and 1430).

The graph 1406 illustrates precision obtained by using a stream-summary data structure to identify heavy hitters. For example, the graph 1406 no longer includes the heavy hitter underestimation seen in the plotted data 1422, 1424, and 1426 or the long tail overestimation seen in plotted data 1428 and 1430.

FIG. 15 illustrates evaluation results 1500 for workload execution statistics for a table partitioning advisor. The evaluation results 1500 display space efficiency results 1502 and runtime overhead results 1504 using a row-level access counter approach 1506, a value range counting approach 1508 (which can have same statistics as a naïve block-level access counting approach), and a combined approach 1510 that uses a stream-summary data structure, for three different benchmarks. While row-level data access counters are 100% precise, memory overhead is high, and the runtime overhead is also notable. In contrast, naïve block-level access counters and the value range counting approach (without a stream-summary) use a fixed memory budget of 1% and achieve low runtime overhead. However, naïve block-level access counters are imprecise, while the value range counting approach achieves more precise estimates (as described above for FIG. 14). Adding the stream-summary data structure further improves precision (e.g., as also described above for FIG. 14) although incurring some additional overhead. Accordingly, a value range counter approach without a stream-summary can be used if runtime overhead is particularly important. Otherwise, a stream-summary data structure can be used to improve precision.

Figure 16:
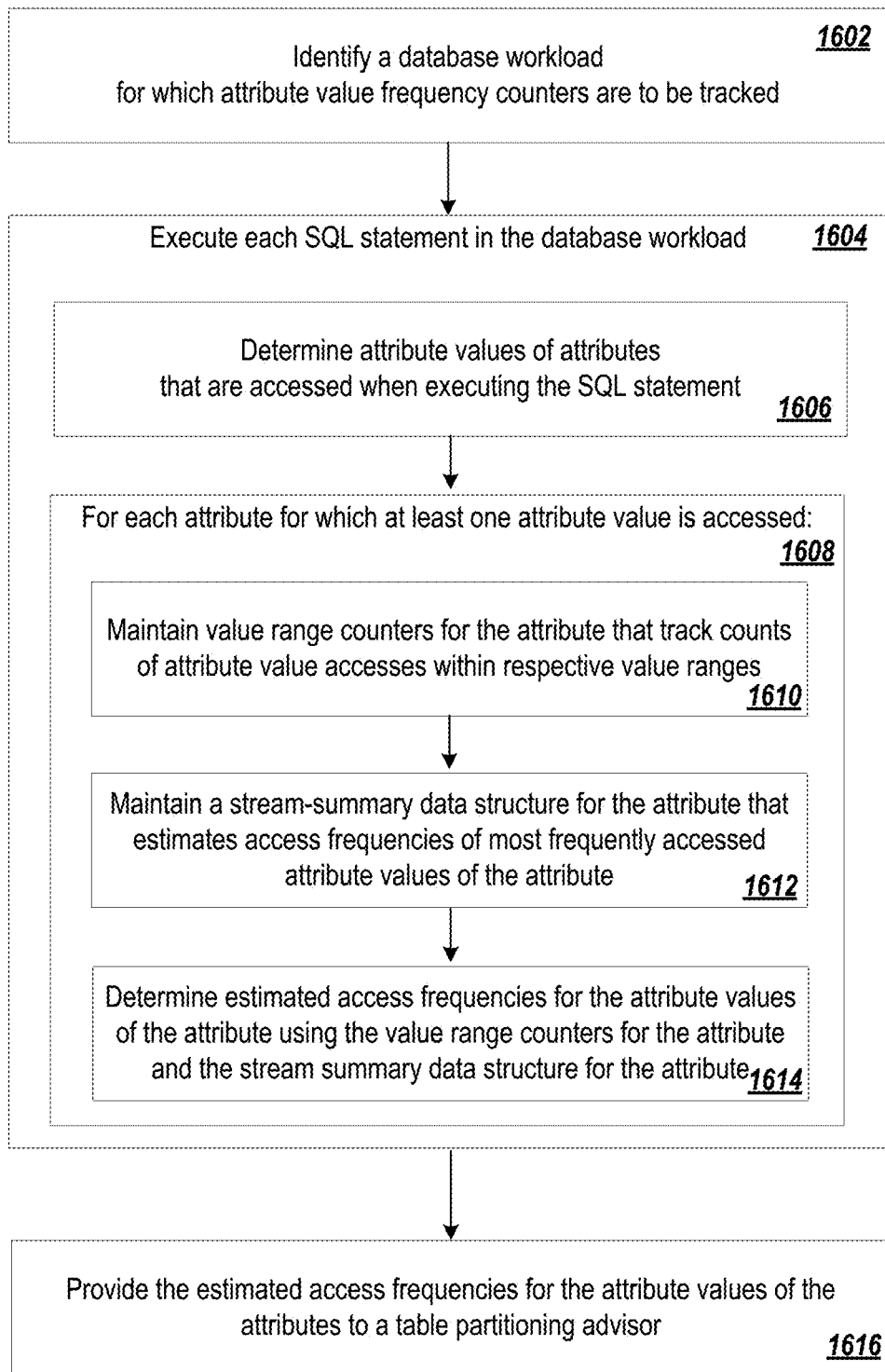
FIG. 16 is a flowchart of an example method for creating and tracking access counters for a table partitioning advisor.

FIG. 16 is a flowchart of an example method 1600 for creating and tracking access counters for a table partitioning advisor. It will be understood that method 1600 and related methods may be performed, for example, by any suitable system, environment, software, and hardware, or a combination of systems, environments, software, and hardware, as appropriate. For example, one or more of a client, a server, or other computing device can be used to execute method 1600 and related methods and obtain any data from the memory of a client, the server, or the other computing device. In some implementations, the method 1600 and related methods are executed by one or more components of the system 100 described above with respect to FIG. 1. For example, the method 1600 and related methods can be executed by the table partitioning advisor 126 of FIG. 1.

At 1602, a database workload is identified for which attribute value frequency counters are to be tracked. The database workload includes at least one SQL statement.

At 1604, each SQL statement in the database workload is executed.

At 1606, executing a respective SQL statement can include determining attribute values of attributes that are accessed when executing the SQL statement.

At 1608, processing is performed for each attribute for which at least one attribute value is accessed.

At 1610, for a respective attribute, value range counters are maintained for the attribute that track counts of attribute value accesses within respective value ranges. Maintaining value range counters for the attribute can include, for a first access of a first attribute value of a first attribute: determining a first value range for the first attribute that includes the first attribute value, from among a collection of value ranges for the first attribute; and incrementing a first value range counter for the first value range, in response to the first access of the first attribute value. Each value range in the collection of value ranges for the first attribute can have a predefined value range size that indicates how many attribute values of a domain of attribute values for the first attribute are included in each value range At 1612, for a respective attribute, a stream-summary data structure is maintained for the attribute that estimates access frequencies of most frequently accessed attribute values of the attribute. The stream-summary data structure for the attribute can include estimated access frequencies for a predetermined number of most frequently accessed attribute values for the attribute.

At 1614, for a respective attribute, estimated access frequencies are determined for the attribute values of the attribute using the value range counters for the attribute and the stream summary data structure for the attribute. Determining estimated access frequencies for the attribute values of the attribute using the value range counters for the attribute and the stream summary data structure for the attribute can include determining, for each of the attribute values of the attribute in the stream-summary data structure, whether the estimated access frequency of the attribute value in the stream-summary data structure is a valid estimated access frequency of a most frequently accessed attribute value. Determining whether the estimated access frequency of the attribute value in the stream-summary data structure is a valid estimated access frequency of a most frequently accessed attribute value can include determining whether the estimated access frequency of the attribute value in the stream-summary data structure is significantly larger than a corresponding value range counter for the attribute value in the stream-summary data structure. Determining whether the estimated access frequency of the attribute value in the stream-summary data structure is significantly larger than corresponding value range counter for the attribute value in the stream-summary data structure can include determining whether the estimated access frequency of the attribute value in the stream-summary data structure is larger than a product of the corresponding value range counter for the attribute value in the stream-summary data structure and a predetermined tolerance parameter. Determining estimated access frequencies for the attribute values of the attribute using the value range counters for the attribute and the stream summary data structure for the attribute can include determining whether a first value range includes an attribute value with a valid estimated access frequency of a most frequently accessed attribute value in the stream summary data structure. In response to determining that the first value range does not include an attribute value with a valid estimated access frequency of a most frequently accessed attribute value in the stream summary data structure, for each attribute value in the first value range, an estimated access frequency of the attribute value in the first value range can be determined by dividing a first value range counter of the first value range by the predetermined value range size. In response to determining that the first value range includes a first attribute value with a valid estimated access frequency of a most frequently accessed attribute value in the stream summary data structure, an adjusted value range counter for the first value range can be determined by subtracting the valid estimated access frequency of the first attribute value from a value range counter for the first value range. For each attribute value in the first value range other than the first value, an estimated access frequency of the attribute value in the first value range can be determined by dividing the adjusted value range counter by the predetermined value range size. A determination can be made that an estimated access frequency of the first attribute value is equal to the valid estimated access frequency of the first attribute value. Value-range based frequency estimates can be determined for the attribute values that are included in the first value range and the value-range based frequency estimates can be provided to the table partitioning advisor as the attribute value frequency counters for the attribute values that are included in the first value range. Determining value-range based frequency estimates for the attribute values that are included in the first value range can include dividing the first value range counter by the predetermined value range size.

At 1616, the estimated access frequencies for the attribute values of the attributes are provided to a table partitioning advisor, as the attribute value frequency counters. The table partitioning advisor can determine one or more table partitioning criteria based on the estimated access frequencies for the attribute values of the attributes.

FIG. 17 is a table 1700 that illustrates a comparison of different approaches for collecting workload execution statistics. The table 1700 compares results of different approaches with respect to precision, space efficiency, and runtime overhead. Precision is compared for F1 (index advisor), F2 (data compression advisor), F3 (buffer pool size advisor), and F4 (table partitioning advisor) statistics. As shown in a row 1702, the improved access counters described herein meet requirements for precision for each of the F1 (index avisor), F2 (data compression advisor), F3 (buffer pool size advisor), and F4 (table partitioning advisor) statistics, as well as for compactness and speed. Other approaches, as discussed below, fail to meet at least some precision, compactness, and/or speed requirements.

A row 1704 displays results for a row-level data access counters approach. Use of the row-level data access counters approach can lead to meeting precision requirements for some statistics, but speed and compactness requirements are not met. For example, a row-level data access counters approach can include analyzing log samples to estimate the access frequency of rows and/or caching runtime access patterns of rows, which can lead to precise statistics for access frequencies of pages (e.g., for F3 (buffer pool size advisor)). However, to also track access frequencies of active domain values precisely (e.g., for F4 table-partitioning advisor), separate counters per domain value and attribute are needed, which results in high memory consumption and runtime overhead. Additionally, the total number of rows that were accessed sequentially or randomly (e.g., for F2, data compression advisor) can only be tracked if additional separate counters of each access type are used, which adds to overhead. Furthermore, row-level counting does not enable determination of output cardinality of selections (e.g., for F1 index advisor).

A row 1706 shows results for a graph representation approach. For example, each row can be represented as a node and edges can connect rows that are accessed within a same transaction. The weight of an edge can denote the number of transactions that accessed both rows. Graphs can be as precise as row-level data access counters (e.g., precise for F2 (data compression advisor), F3 (buffer pool size advisor), and F4 (table partitioning advisor) but not for F1 (index avisor)). However, memory and runtime overhead of a graph approach depends on the workload. For example, if transactions touch many rows, graph-based approaches can result in high memory and runtime overhead, thus not fully meeting compactness or speed requirements.

A row 1708 shows results for a block-level data access counters approach, which can leverage access frequencies at an extent level collected during workload execution. Cold pages can be identified using flags of a processor's memory management unit for each virtual memory page. Accordingly, block-level data access counters can provide precise access frequencies of pages (e.g., for F3, buffer pool size advisor). Additionally, the total number of rows sequentially or randomly accessed can be available if separate counters for each access type are maintained (e.g., for F2, data compression advisor). However, tracking accuracy for accesses to the active domain (e.g., for F4, table-partitioning advisor) can depend heavily on the workload, meaning block-level data access counters does not meet precision requirements for heavy workloads. Furthermore, block-level access counters lack the access granularity of row-level access counters for F1, index advisor. While block-level access counters can be compact, runtime overhead can depend on the workload. In a worst-case, all counters of all blocks accessed need to be incremented (e.g., during a full column scan). Accordingly, block-level access counters does not fully meet a compactness requirement.

A row 1710 shows results for use of a what-if API (Application Programming Interface) for queries. For example, workload execution statistics can be collected for a workload by feeding the workload's SQL statements into offline physical design advisors, which can use a query optimizer's what-if API. While the collected SQL statements are compact, actual physical accesses to the data are not tracked and thus what-if approach fails to provide accurate statistics as it relies on estimates.

A row 1712 shows results for a memory access tracing approach. Memory access tracing can use a PEBS (Processor Event-Based Sampling) mechanism of processors to trace memory accesses which can be mapped to database data to determine precise access frequencies of pages (e.g., for F3, buffer pool size advisor) and values of the active attribute domain (e.g., for F4, table partitioning advisor). However, since only single memory accesses are traced, access granularity (e.g., for F1, index advisor) and access type (e.g., for F2, data compression advisor) cannot be identified. Additionally, since memory traces are logged and analyzed offline, memory and runtime overhead is high, resulting in failure to meet compactness and speed requirements.

The included figures and accompanying description illustrate example processes and computer-implementable techniques. But the system (or its software or other components) contemplates using, implementing, or executing any suitable technique for performing these and other tasks. It will be understood that these processes are for illustration purposes only and that the described or similar techniques may be performed at any appropriate time, including concurrently, individually, or in combination. In addition, many of the operations in these processes may take place simultaneously, concurrently, and/or in different orders than as shown. Moreover, system 100 may use processes with additional operations, fewer operations, and/or different operations, so long as the methods remain appropriate.

In other words, although this disclosure has been described in terms of certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure.

What is claimed is:

1. A computer-implemented method comprising:
    identifying a database workload for which database page access frequencies are to be tracked, wherein the database workload includes at least one SQL (Structured Query Language) statement;
    executing each SQL statement in the database workload, wherein executing a respective SQL statement comprises accessing attribute values for at least one attribute when executing the SQL statement;
    for each attribute for which attribute values are accessed:
        determining at least one accessed database page that is accessed when accessing attribute values for the attribute for a query execution;
        determining a page range of the at least one accessed database page that is accessed when accessing attribute values for the attribute for the query execution, wherein the page range is defined by a starting page and an ending page and wherein each accessed page in the page range has a page index corresponding to the accessed page;
        for each attribute value access of the attribute, modifying a first page counter corresponding to the starting page and a last page counter corresponding to the ending page without modifying any page counters corresponding to any intervening accessed pages that are between the starting page and the ending page, wherein modifying the first page counter and the last page counter comprises:
            incrementing the first page counter in a collection of page counters, wherein the first page counter has a first index corresponding to the page index of the starting page of the page range; and
            decrementing the last page counter in the collection of page counters, wherein the second page counter has a second index corresponding to a value equal to one more than the page index of the ending page of the page range;
    determining a page access frequency for each database page in the page range based on the page counters, wherein determining the page access frequency for each respective database page comprises determining a prefix sum of a range of page counters starting with the first page counter for the first page and ending with a page counter for the database page; and
    providing determined page access frequencies to a buffer pool size advisor, wherein the buffer pool size advisor determines, based on the page access frequencies, a size of a buffer pool for storing frequently-accessed database pages.

2. The computer-implemented method of claim 1, wherein the workload includes a first SQL statement that includes a filter predicate on a first attribute.

3. The computer-implemented method of claim 2, wherein executing the first SQL statement comprises performing a sequential scan of all database pages that include attribute values for the first attribute to determine which attribute values match the filter predicate.

4. The computer-implemented method of claim 3, wherein the starting page of the page range comprises a first database page accessed during the sequential scan and the ending page of the page range comprises a last database page accessed during the sequential scan.

5. The computer-implemented method of claim 1, wherein:
    the workload includes a second SQL statement; and
    executing the second SQL statement comprises randomly accessing a first database page to retrieve a first attribute value for a first attribute.

6. The computer-implemented method of claim 5, wherein the page range comprises the first database page that was randomly accessed during execution of the second SQL statement.

7. The computer-implemented method of claim 5, wherein the starting page of the page range comprises the first database page and the ending page of the page range comprises the first database page.

8. The computer-implemented method of claim 1, wherein the buffer pool size advisor uses the page access frequencies to determine a buffer pool size for the workload.

9. A system comprising:
    one or more computers; and
    a computer-readable medium coupled to the one or more computers having instructions stored thereon which, when executed by the one or more computers, cause the one or more computers to perform operations comprising:

identifying a database workload for which database page access frequencies are to be tracked, wherein the database workload includes at least one SQL (Structured Query Language) statement;

executing each SQL statement in the database workload, wherein executing a respective SQL statement comprises accessing attribute values for at least one attribute when executing the SQL statement;

for each attribute for which attribute values are accessed:
determining at least one accessed database page that is accessed when accessing attribute values for the attribute for a query execution;

determining a page range of the at least one accessed database page that is accessed when accessing attribute values for the attribute for the query execution, wherein the page range is defined by a starting page and an ending page and wherein each accessed page in the page range has a page index corresponding to the accessed page;

for each attribute value access of the attribute, modifying a first page counter corresponding to the starting page and a last page counter corresponding to the ending page without modifying any page counters corresponding to any intervening accessed pages that are between the starting page and the ending page, wherein modifying the first page counter and the last page counter comprises:
incrementing the first page counter in a collection of page counters, wherein the first page counter has a first index corresponding to the page index of the starting page of the page range; and
decrementing the last page counter in the collection of page counters, wherein the second page counter has a second index corresponding to a value equal to one more than the page index of the ending page of the page range, determining a page access frequency for each database page in the page range based on the page counters, wherein determining the page access frequency for each respective database page comprises determining a prefix sum of a range of page counters starting with the first page counter for the first page and ending with a page counter for the database page; and providing determined page access frequencies to a buffer pool size advisor, wherein the buffer pool size advisor determines, based on the page access frequencies, a size of a buffer pool for storing frequently-accessed database pages.

10. The system of claim 9, wherein the workload includes a first SQL statement that includes a filter predicate on a first attribute.

11. The system of claim 10, wherein executing the first SQL statement comprises performing a sequential scan of all database pages that include attribute values for the first attribute to determine which attribute values match the filter predicate.

12. The system of claim 11, wherein the starting page of the page range comprises a first database page accessed during the sequential scan and the ending page of the page range comprises a last database page accessed during the sequential scan.

13. The system of claim 9, wherein:
the workload includes a second SQL statement; and
executing the second SQL statement comprises randomly accessing a first database page to retrieve a first attribute value for a first attribute.

14. The system of claim 13, wherein the page range comprises the first database page that was randomly accessed during execution of the second SQL statement.

15. A computer program product encoded on a non-transitory storage medium, the product comprising non-transitory, computer readable instructions for causing one or more processors to perform operations comprising:

identifying a database workload for which database page access frequencies are to be tracked, wherein the database workload includes at least one SQL (Structured Query Language) statement;

executing each SQL statement in the database workload, wherein executing a respective SQL statement comprises accessing attribute values for at least one attribute when executing the SQL statement;

for each attribute for which attribute values are accessed:
determining at least one accessed database page that is accessed when accessing attribute values for the attribute for a query execution;

determining a page range of the at least one accessed database page that is accessed when accessing attribute values for the attribute for the query execution, wherein the page range is defined by a starting page and an ending page and wherein each accessed page in the page range has a page index corresponding to the accessed page;

for each attribute value access of the attribute, modifying a first page counter corresponding to the starting page and a last page counter corresponding to the ending page without modifying any page counters corresponding to any intervening accessed pages that are between the starting page and the ending page, wherein modifying the first page counter and the last page counter comprises:
incrementing the first page counter in a collection of page counters, wherein the first page counter has a first index corresponding to the page index of the starting page of the page range; and
decrementing the last page counter in the collection of page counters, wherein the second page counter has a second index corresponding to a value equal to one more than the page index of the ending page of the page range;

determining a page access frequency for each database page in the page range based on the page counters, wherein determining the page access frequency for each respective database page comprises determining a prefix sum of a range of page counters starting with the first page counter for the first page and ending with a page counter for the database page; and providing determined page access frequencies to a buffer pool size advisor, wherein the buffer pool size advisor determines, based on the page access frequencies, a size of a buffer pool for storing frequently-accessed database pages.

16. The computer program product of claim 15, wherein the workload includes a first SQL statement that includes a filter predicate on a first attribute.

17. The computer program product of claim 16, wherein executing the first SQL statement comprises performing a sequential scan of all database pages that include attribute values for the first attribute to determine which attribute values match the filter predicate.

18. The computer program product of claim 17, wherein the starting page of the page range comprises a first database page accessed during the sequential scan and the ending page of the page range comprises a last database page accessed during the sequential scan.

19. The computer program product of claim 15, wherein:
the workload includes a second SQL statement; and
executing the second SQL statement comprises randomly accessing a first database page to retrieve a first attribute value for a first attribute.

* * * * *